(12) United States Patent
Kobayashi et al.

(10) Patent No.: US 11,765,907 B2
(45) Date of Patent: Sep. 19, 2023

(54) FERROELECTRIC MEMORY DEVICE AND OPERATION METHOD THEREOF

(71) Applicant: JAPAN SCIENCE AND TECHNOLOGY AGENCY, Kawaguchi (JP)

(72) Inventors: Masaharu Kobayashi, Tokyo (JP); Fei Mo, Tokyo (JP); Toshiro Hiramoto, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 17/591,102

(22) Filed: Feb. 2, 2022

(65) Prior Publication Data
US 2022/0157833 A1 May 19, 2022

Related U.S. Application Data

(63) Continuation of application No. PCT/JP2020/021963, filed on Jun. 3, 2020.

(30) Foreign Application Priority Data

Aug. 8, 2019 (JP) .................................. 2019-146870

(51) Int. Cl.
*G11C 11/22* (2006.01)
*H10B 51/30* (2023.01)
*H10B 51/20* (2023.01)

(52) U.S. Cl.
CPC ............ *H10B 51/30* (2023.02); *G11C 11/223* (2013.01); *G11C 11/2275* (2013.01); *H10B 51/20* (2023.02)

(58) Field of Classification Search
None
See application file for complete search history.

(56) References Cited

U.S. PATENT DOCUMENTS 6,532,165 B1    3/2003 Katori
10,008,614 B1 *  6/2018 He ....................... H01L 29/1054
(Continued)

FOREIGN PATENT DOCUMENTS

JP    2000340759 A    12/2000
JP    2010267705 A    11/2010
(Continued)

OTHER PUBLICATIONS

Kim "Ferroelectric Analog Synaptic Transistors", Nano Letters, 19 (3), 2044-2050. Jan. 2019: pp. A-G. DOI: https://doi.org/10.1021/acs.nanolett.9b00180. Cited in the specification.
(Continued)

*Primary Examiner* — Tan T. Nguyen
(74) *Attorney, Agent, or Firm* — ROSSI, KIMMS & McDOWELL LLP

(57) ABSTRACT

A ferroelectric memory device comprising a plurality of ferroelectric memory elements. Each of the plurality of ferroelectric memory elements includes a channel layer containing a metal oxide, a ferroelectric layer in contact with the channel layer in which the ferroelectric layer contains hafnium oxide, a first gate electrode facing the channel layer via the ferroelectric layer, an insulating layer facing the ferroelectric layer via the channel layer; and a second gate electrode facing the channel layer via the insulating layer.

17 Claims, 28 Drawing Sheets

(56) References Cited

U.S. PATENT DOCUMENTS

| | | | | |
|---|---|---|---|---|
| 2011/0299318 | A1* | 12/2011 | Kaneko | H01L 29/6684 257/295 |
| 2019/0244653 | A1 | 8/2019 | Tsukamoto | |
| 2020/0035837 | A1* | 1/2020 | Ahmed | H01L 29/78696 |
| 2020/0098875 | A1* | 3/2020 | Sung | H01L 29/78681 |

FOREIGN PATENT DOCUMENTS

| | | |
|---|---|---|
| JP | 2018067664 A | 4/2018 |
| WO | 2010097862 A1 | 9/2010 |
| WO | 2018125118 A1 | 7/2018 |

OTHER PUBLICATIONS

Li "A Ferroelectric Thin Film Transistor Based on Annealing-Free HfZrO Film", IEEE Journal of the Electron Devices Society, vol. 5, No. 5, pp. 378-383, Sep. 2017. DOI: 10.1109/JEDS.2017.2732166. Cited in the specification.

Florent "Vertical Ferroelectric HfO2 FET based on 3-D NAND Architecture: Towards Dense Low-Power Memory," 2018 IEEE International Electron Devices Meeting (IEDM), 2018: pp. 2.5.1-2.5.4. DOI: 10.1109/IEDM.2018.8614710. Cited in the specification.

MO "Experimental Demonstration of Ferroelectric HfO2 FET with Ultrathin-body IGZO for High-Density and Low-Power Memory Application," 2019 Symposium on VLSI Technology Digest of Technical Papers, Jun. 2019: pp. T42-T43. DOI: 10.23919/VLSIT. 2019.8776553.

"[Joint Announcement] Successful Development of New Device Combining IGZO and Next-Generation Functional Materials—Expectations for Low Power Consumption, High Speed and Large Capacity Memory Devices—(Presented by: Japan Science and Technology Agency)", Press Release on website of The Institute of Industrial Science, the University of Tokyo. Jun. 10, 2019. URL: https://www.iis.utokyo.ac.jp/ja/news/3125/. Cited in NPL 13. English machine translation provided.

"Successful Development of New Device Combining IGZO and Next-Generation Functional Materials—Expectations for Low Power Consumption, High Speed and Large Capacity Memory Devices—",Press Release on website of Japan Science and Technology Agency (JST) Jun. 10, 2019. URL: https://www.jst.go.jp/pr/announce/20190610/index.html. English machine translation provided.

Mo "Experimental Demonstration of Ferroelectric HfO2 FET with Ultrathin-body IGZO for High-Density and Low-Power Memory Application", Presentation slides for 2019 VLSI Technology Symposium, Jun. 11, 2019: pp. 1-22.

Kobayashi "[Invited talk] Study on Ferroelectric Transistor Memory with Ultra-thin IGZO Channel", Proceedings of Technical Committee on Silicon Device and Materials (SDM) of IEICE, IEICE Technical Report, vol. 119, No. 161, Aug. 2019: pp. 59-62. English machine translation provided.

Mo "Study on Ferroelectric Transistor Memory with Ultra-thin IGZO Channel", Presentation slides for Technical Committee on Silicon Device and Materials (SDM) of IEICE, Aug. 9, 2019. English Machine translation of the front page provided.

Mo "Demonstration of HfO2 based Ferroelectric FET with Ultrathin-body IGZO for High-Density Memory Application", Proceedings of The 80th JSAP Autumn Meeting, 18p-B11-2, Sep. 2019.

Mo "Demonstration of HfO2 based Ferroelectric FET with Ultrathin-body IGZO for High-Density Memory Application", Presentation slides for The 80th JSAP Autumn Meeting, Sep. 2019.

Kobayashi, "Emerging ferroelectric memory devices enabled by material innovation", Conference Paper for The 8th International Symposium on Control of Semiconductor Interfaces (ISCSI-VIII), Nov. 27, 2019.

International search report issued in Intl. Appln. No. PCT/JP2020/021963 dated Aug. 4, 2020. English translation provided.

Written Opinion issued in Intl. Appln. No. PCT/JP2020/021963 dated Aug. 4, 2020. English translation provided.

Florent "Reliability Study of Ferroelectric Al:HfO2 Thin Films for DRAM and NAND Applications," in IEEE Transactions on Electron Devices. Oct. 2017: pp. 4091-4098, vol. 64, No. 10, doi: 10.1109/TED.2017.2742549. Cited in the specification.

Office Action issued in Korean Appin. No. 10-2022-7005351, dated Jul. 19, 2023. English machine translation provided.

* cited by examiner

Polarization switched

High potential barrier caused by switched Polarization.

L= 30 nm
Potential distribution

Potential barrier connected

L= 100 nm
Potential distribution

Potential barrier closed

FERROELECTRIC MEMORY DEVICE AND OPERATION METHOD THEREOF

CROSS REFERENCE TO RELATED APPLICATIONS

This application is a Continuation of International Patent Application No. PCT/JP2020/021963, filed on Jun. 3, 2020, which claims priority to Japanese Patent Application No. 2019-146870, filed on Aug. 8, 2019, the disclosures of which are incorporated herein by reference for all purposes as if fully set forth herein.

FIELD

An embodiment of the present invention relates to a non-volatile memory element. In particular, an embodiment of the present invention relates to a transistor-type non-volatile memory device (Ferroelectric Field Effect Transistor: hereinafter referred to as "FeFET") using a ferroelectric as a gate insulating layer.

BACKGROUND

In recent years, with the sophistication of semiconductor systems, information communication has been required in various situations of daily life. Implementation of so-called IoT (Internet of Things) requires high-speed and high-capacity information communication between a computer (e.g., server) and a household electric appliance (also referred to as an edge device). For this purpose, a non-volatile memory as a high-speed and large-capacity storage memory is required for a household electric appliance. In addition, with the downsizing of a household electric appliance, a non-volatile memory is strongly required to have low power consumption.

A ferroelectric memory, which has long been known as a non-volatile memory element, is attracting new attention as the demand for non-volatile memory expands. A commercialized ferroelectric memory is an element composed of cells using a field effect transistor (FET) as a switch and using a ferroelectric as a capacitor. In this element, although piezoelectric ceramics such as PZT (lead zirconate titanate) are used as a ferroelectric material, PZT has a size effect of losing ferroelectricity when thinned. Therefore, although the density of the flash memory has been increased, the density of the ferroelectric memory has hardly been increased.

Under these circumstances, it was published in 2011 that a material doped with elements such as Si in hafnium oxide ($HfO_2$) exhibited ferroelectric properties in a thin film, and their sizing effects were significantly less than those of known PZT and the like. A ferroelectric memory using these hafnium oxide-based materials is characterized by high consistency with a CMOS process, fast erase/program speed, and low power consumption at low-voltage operation. Therefore, an FeFET which utilizes the hafnium oxide-based material as a gate insulating layer has been developed extensively recently (for example, see Min-Kyu Kim, Jang-Sik Lee, "Ferroelectric Analog Synaptic Transistors", [online], Jan. 30, 2019, American Chemical Society, [Searched Feb. 13, 2019], Internet <URL:https://pubs.acs.org/doi/abs/10.1021/acs.nanolett.9b00180>(2019) and Yuxing Li, Renrong Liang, Jiabin Wang, Ying Zhang, He Tian, Houfang Liu, Songlin Li, Weiquan Mao, Yu Pang, Yutao Li, Yi Yang, Tian-Ling Ren, "A Ferroelectric Thin Film Transistor Based on Annealing-Free HfZrO Film", Jul. 26, 2017, IEEE Journal of the Electron Devices Society, Volume 5, Page(s):378-383, (2017)). For further capacity enlargement of a storage memory, memory of high density and low power consumption which integrates multiple FeFETs in three-dimensional structure has also been proposed (for example, see K. Florent, M. Pesic, A. Subirats, K. Banerjee, S. Lavizzari, A. Arreghini, L. Di Piazza, G. Potoms, F. Sebaai, S. R. C. McMitchell, M. Popovici, G. Groeseneken, J. Van Houdt, "Vertical Ferroelectric $HfO_2$ FET based on 3-D NAND Architecture: Towards Dense Low-Power Memory", 2018 IEEE International Electron Devices Meeting (IEDM), Page (s):2.5.1-2.5.4, (2018)).

SUMMARY

A non-volatile memory element (specifically, a ferroelectric memory element) according to an embodiment of the present invention includes a channel layer containing a metal oxide, a ferroelectric layer in contact with the channel layer, the ferroelectric layer containing hafnium oxide, and a gate electrode facing the channel layer via the ferroelectric layer, wherein a channel length of the channel layer is 1 μm or less. "C facing B via A" is a relationship that should be satisfied by at least a part of A, at least a part of B, and at least a part of C, and is not limited to a relationship that should be satisfied by all of A, all of B, or all of C.

The ferroelectric memory element according to an embodiment of the present invention includes a channel layer containing a metal oxide, a ferroelectric layer in contact with the channel layer, the ferroelectric layer containing hafnium oxide, a first gate electrode facing the channel layer via the ferroelectric layer, an insulating layer facing the ferroelectric layer via the channel layer, and a second gate electrode facing the channel layer via the insulating layer. The insulating layer may include silicon oxide. A ratio of a thickness of the insulating layer to a thickness of the channel layer may be 1.0 or more and 1.8 or less (preferably 1.4 or more and 1.6 or less).

In the ferroelectric memory element, the metal oxide is preferably a metal oxide composed of one or a plurality of metals selected from a group consisting of In, Ga, Zn, and Sn, for example. For example, the metal oxide may be IGZO (a metal oxide composed of indium, gallium, zinc, and oxygen), ITO (Indium Tin Oxide), IZO (Indium Zinc Oxide), ITZO (Indium Tin Zinc Oxide, or ZnO (Zinc Oxide). However, the present invention is not limited thereto, and any metal oxide having the same characteristics as the metal oxide can be used as the channel layer. The thickness of the channel layer may be less than 10 nm (preferably, 8 nm or less, more preferably 6 nm or less). The thickness of the channel layer may be 1 nm or more (preferably 2 nm or more). The thickness of the ferroelectric layer may be 5 nm or more and 20 nm or less.

Further, a ferroelectric memory device according to an embodiment of the present invention may be configured to include a plurality of ferroelectric memory elements.

In a method of operating a ferroelectric memory device including a plurality of ferroelectric memory elements according to an embodiment of the present invention, each ferroelectric memory element includes a channel layer containing a metal oxide, a ferroelectric layer in contact with the channel layer, the ferroelectric layer containing hafnium oxide, a first gate electrode facing the channel layer via the ferroelectric layer, an insulating layer facing the ferroelectric layer via the channel layer, a second gate electrode facing the channel layer via the insulating layer, a source electrode in contact with the channel layer, and a drain electrode separated from the source electrode and in contact with the channel layer. In this case, the method of operating the ferroelectric memory device includes an erase operation in which a negative gate voltage is applied to the first gate electrodes and a first positive drain voltage is applied to the drain electrodes in at least a part of the plurality of ferroelectric memory elements, and a program operation in which a positive gate voltage is applied to the first gate electrodes and a second drain voltage is applied to the drain electrodes in at least a part of the plurality of ferroelectric memory elements.

In a method of operating a ferroelectric memory device including a plurality of ferroelectric memory elements according to an embodiment of the present invention, each ferroelectric memory element includes a channel layer containing a metal oxide, a ferroelectric layer in contact with the channel layer, the ferroelectric layer containing hafnium oxide, a gate electrode facing the channel layer via the ferroelectric layer, a source electrode in contact with the channel layer, and a drain electrode separated from the source electrode and in contact with the channel layer, wherein a channel length of the channel layer is 1 μm or less. In this case, the method of operating the ferroelectric memory device includes an erase operation in which a negative gate voltage is applied to the gate electrodes and a positive first drain voltage is applied to the drain electrodes in at least a part of the plurality of ferroelectric memory elements, and a program operation in which a positive gate voltage is applied to the gate electrodes and a second drain voltage is applied to the drain electrodes in at least a part of the plurality of ferroelectric memory elements.

The second drain voltage may be a positive voltage or 0 V. The first drain voltage may be greater than the second drain voltage.

DESCRIPTION OF EMBODIMENTS

Conventionally, single-crystal silicon with good consistency with a CMOS process has been used as a channel layer of an FeFET. However, when integrating the FeFET in a three-dimensional structure, the single-crystal silicon cannot be used as the channel layer. Therefore, in the prior art described in paragraph 0005, a polysilicon film is used as the channel layer to integrate the FeFET to form a memory having the same structure as a NAND flash memory with a three-dimensional structure.

However, there are some objects in the FeFET using a polysilicon film as the channel layer. The first object is that the polysilicon film formed into a thin film for high integration has low carrier mobility, and therefore low read current. The second object is that an interface layer having low dielectric constant (low-k layer) is formed between the ferroelectric, which is the gate insulating layer, and the polysilicon film, resulting in voltage loss. The third problem is that the reliability of the FeFET deteriorates due to charge-trapping caused by the interface layer having low quality. Therefore, development of a highly reliable ferroelectric memory that solves these problems is required.

One of the objects of the present invention is to provide a highly reliable non-volatile memory element (specifically, a ferroelectric memory element) even when highly integrated.

Embodiments of the present invention will be described below with reference to the drawings and the like. However, the present invention can be implemented in various modes without departing from the gist thereof and should not be construed as being limited to the description of the following exemplary embodiments. For the sake of clarity of description, although the drawings may be schematically represented with respect to widths, thicknesses, shapes, and the like of the respective portions compared with actual embodiments, those are merely examples and do not limit the interpretation of the present invention. In this specification and each drawing, elements having the same functions as those described with reference to the preceding drawings are denoted by the same symbols, and a repetitive description thereof may be omitted.

In each of the embodiments described below, the temperature conditions for the measurement or simulation are both room temperature.

First Embodiment

[Element Structure]

In the present embodiment, a non-volatile memory element 100 according to an embodiment of the present invention will be described with reference to FIG. 1. However, FIG. 1 shows a concept of an element structure in the non-volatile memory element 100 of the present embodiment and is not limited to this example.

Figure 1:
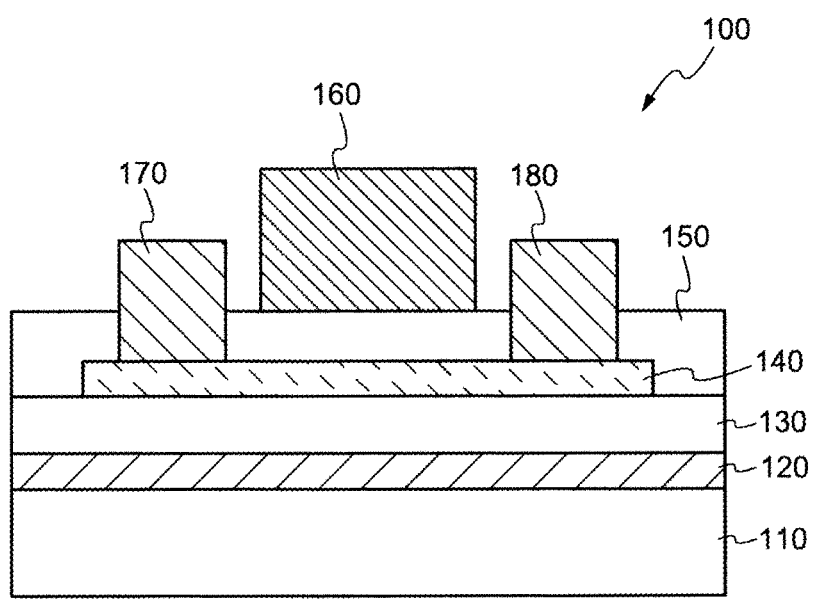
FIG. 1 is a cross-sectional view showing an element structure in a non-volatile memory element of a first embodiment.

FIG. 1 is a cross-sectional view showing an element structure of the non-volatile memory element 100 according to a first embodiment. As shown in FIG. 1, the non-volatile memory element 100 is the FeFET. Specifically, the non-volatile memory element 100 has at least a first gate electrode 120, a gate insulating layer 130, a channel layer 140, a protective insulating layer 150, a second gate electrode 160, a source electrode 170, and a drain electrode 180.

A substrate 110 functions as a base for supporting the non-volatile memory device 100. In the present embodiment, although a structure in which silicon oxide is provided on a silicon substrate is used as the substrate 110, the present invention is not limited thereto.

The first gate electrode 120 functions as a front gate electrode of the non-volatile memory element 100. In the present embodiment, a compound layer made of titanium nitride (TiN) with a thickness of 20 nm is used as the first gate electrode 120. However, the material of the first gate electrode 120 is not limited to this, and a metal material including tungsten, tantalum, molybdenum, aluminum, copper, or the like, or a compound material containing such metal materials can be used. The first gate electrode 120 may be formed by, for example, a sputtering method.

The gate insulating layer 130 corresponds to the ferroelectric layer in the non-volatile memory element 100 of the present embodiment. In the present embodiment, hafnium oxide with zirconium added (hereinafter referred to as "HZO") is used as a material constituting the gate insulating layer 130. However, the present invention is not limited thereto, and other ferroelectric layers such as hafnium oxide with silicon, aluminum, gadolinium, yttrium, lanthanum, strontium, or the like added may be used as the gate insulating layer 130. In the present embodiment, the gate insulating layer 130 is formed using an ALD (Atomic Layer Deposition) method at a temperature of 250° C. with a thickness of 15 nm. However, the thickness of the gate insulating layer 130 is not limited to this example, and may be, for example, 5 nm or more and 20 nm or less (preferably 10 nm or more and 18 nm or less).

The channel layer 140 functions as a channel of the non-volatile memory element 100. In the present embodiment, a metal oxide called an IGZO is used as a material constituting the channel layer 140. The IGZO is a metal oxide that exhibits semiconductor properties and is a compound material composed of indium, gallium, zinc, and oxygen. Specifically, the IGZO is an oxide containing In, Ga, and Zn, or a mixture of such an oxide. The composition of the IGZO is preferably $In_{2-x}Ga_xO_3(ZnO)_m$ ($0<x<2$, m is 0 or a natural number less than 6), more preferably $InGaO_3(ZnO)_m$ (m is 0 or a natural number less than 6), most preferably $InGaO_3(ZnO)$. As will be described later, the non-volatile memory element 100 of the present embodiment achieves higher reliability than the conventional FeFET using the polysilicon film as the channel layer by using the IGZO as the channel layer 140. By contacting the gate insulating layer 130, which is the ferroelectric layer, and the channel layer 140, the formation of the interface layer having low dielectric constant described in paragraph 0015 is suppressed. In the present embodiment, an IGZO film with a thickness of 8 nm is formed as the channel layer 140 by an RF-sputtering method. According to the findings of the present inventors, the thickness of the channel layer 140 is preferably less than 10 nm. This point will be described later.

The protective insulating layer 150 is a dielectric that functions as a passivation layer for protecting the channel layer 140. In the present embodiment, a silicon oxide film (SiO) is formed as the protective insulating layer 150 by the RF-sputtering method. However, the present invention is not limited thereto, other insulating films such as a silicon nitride film (SiN), a silicon oxide nitride film (SiON) may be used as the protective insulating layer 150. In the present embodiment, although the thickness of the protective insulating layer 150 (the thickness between the channel layer 140 and the second gate electrode 160) was set to 12 nm, the present invention is not limited to this. In this specification, it is assumed that the thickness of the protective insulating layer 150 is a thickness converted to a thickness of a silicon oxide film ($SiO_2$) (EOT: Equivalent Oxide Thickness).

In the present embodiment, after forming the protective insulating layer 150, a contact hole is formed in the protective insulating layer 150 to connect the source electrode 170 and the drain electrode 180, which will be described later, to the channel layer 140. After forming the contact hole, 500° C. and 10 seconds of RTA (Rapid Thermal Anneal) treatment is performed in an atmosphere containing nitrogen and oxygen. However, the temperature of the RTA treatment may be 400° C. or less. This RTA treatment is an annealing process for crystallizing an HZO film which is the gate insulating layer 130.

The second gate electrode 160 functions as a back gate electrode of the non-volatile memory element 100. Specifically, the second gate electrode 160 has the role of fixing a body potential of a channel portion. In the present embodiment, an electrode having a stacked structure composed of a titanium layer with a thickness of 10 nm and an aluminum layer with a thickness of 100 nm is used as the second gate electrode 160. However, the material of the second gate electrode 160 is not limited to this, and a metal material including tungsten, tantalum, molybdenum, copper, or the like, or a compound material containing such metal materials can be used. The second gate electrode 160 may be formed, for example, by an electron-beam evaporation method.

The source electrode 170 and the drain electrode 180 function as terminals for electrically connecting to the channel layer 140, respectively. In the present embodiment, the source electrode 170 and the drain electrode 180 are composed of the same metal layer as the second gate electrode 160. That is, the source electrode 170 and the drain electrode 180 have a stacked structure composed of a titanium layer with a thickness of 10 nm and an aluminum layer with a thickness of 100 nm. However, the present invention is not limited to this example, the second gate electrode 160, the source electrode 170 and the drain electrode 180 can be composed of different metal materials.

In FIG. 1, an example that the bottom gate (the first gate electrode 120) is used as the front gate, and the top gate (the second gate electrode 160) is used as the back gate has been shown. However, on the contrary, the bottom gate may be used as the back gate, and the top gate may be used as the front gate. That is, it may be configured to fix the body potential using the gate electrode arranged below the channel layer composed of the IGZO film.

[Comparison Between Polysilicon Film and IGZO Film]

As described above, in the non-volatile memory element 100 of the present embodiment, the ferroelectric containing hafnium oxide is used as the gate insulating layer 130, and the IGZO film is used as the channel layer 140. First, the advantages of using the IGZO film as the channel layer 140 will be described.

Figure 2A:
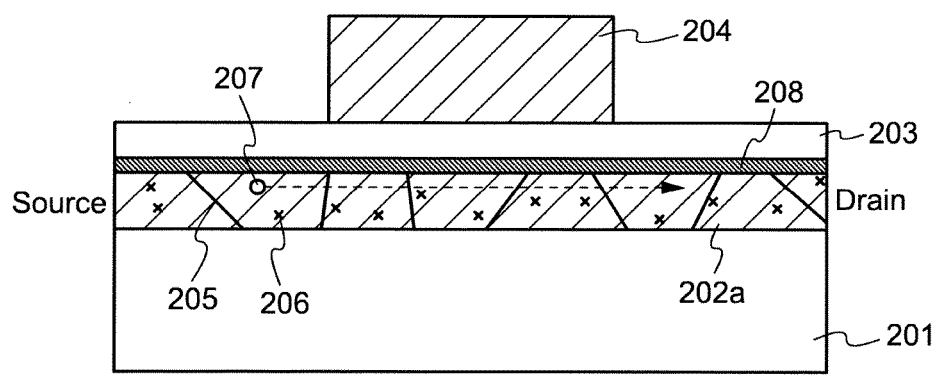
FIG. 2A and FIG. 2B are conceptual diagrams for explaining a difference in transistor characteristics due to a difference in a material of a channel layer.
Figure 2B:
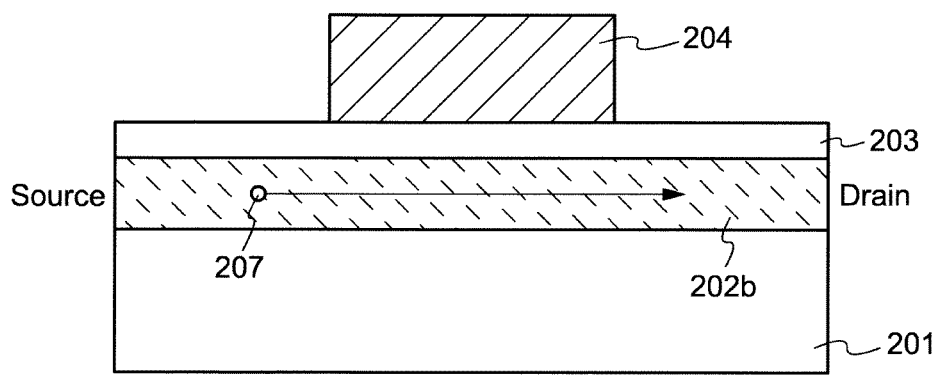

FIG. 2A and FIG. 2B are conceptual diagrams for explaining a difference in transistor characteristics due to a difference in a material of a channel layer. In FIG. 2A, a channel layer 202a, a gate insulating layer 203, and a gate electrode 204 are arranged above a substrate 201. The difference between FIG. 2A and FIG. 2B is that a polysilicon film is used as the channel layer 202a in FIG. 2A, and an IGZO film is used as a channel layer 202b in FIG. 2B.

As shown in FIG. 2A, in the case where a polysilicon film is used as the channel layer 202a, there are many grain boundaries 205 and crystal defects 206 inside the film. These grain boundaries 205 and the crystal defects 206 cause a decrease in the mobility of a carrier 207 in the channel layer 202a. In addition, an interface layer having low dielectric constant (low-k layer) 208 is formed between the ferroelectric layer, which is the gate insulating layer 203, and the poly-silicon film, which is the channel layer 202a. The interface layer 208 becomes a factor of voltage loss when supplying a voltage to the gate electrode 204. Charge-trapping generated by the interface layer 208 with low quality also cause degradation of element characteristics (e.g., shift of threshold voltage, degradation of subthreshold swing, etc.). Therefore, when a poly-silicon film is used as the channel layer 202a, low-voltage operation becomes difficult as a non-volatile memory element, and reliability is impaired.

On the other hand, as shown in FIG. 2B, in the case where the IGZO film is used as the channel layer 202b, the interface layer 208 as described above is hardly formed. In addition, since the IGZO film has a sufficient carrier mobility in a film-formed state (i.e., amorphous state), there is no need to be polycrystalline by annealing treatment, it is not affected by the grain boundaries and the crystal defects. The IGZO film functions as an n-type semiconductor material. Furthermore, the non-volatile memory element using the IGZO film can be operated as a junctionless FET (a transistor without pn junction). Therefore, as shown in FIG. 2B, the carrier 207 moves in the channel body (near the center of the channel), and the carrier 207 is less susceptible to charge-trapping near the interface layer. Therefore, a highly reliable non-volatile memory element can be realized by using the IGZO film as the channel layer 202b.

In the case where the IGZO film is used as the channel layer and the hafnium oxide-based material is used as the gate insulating layer, the FeFET with excellent interface characteristics can be configured as described above. Therefore, not limited to the case where the non-volatile memory element using the IGZO film is operated as the junctionless FET, the non-volatile memory element using the IGZO film can be applied to an FET that is operated in an inversion mode in conjunction with a p-type semiconducting material.

[Element Characteristics]

Figure 3:
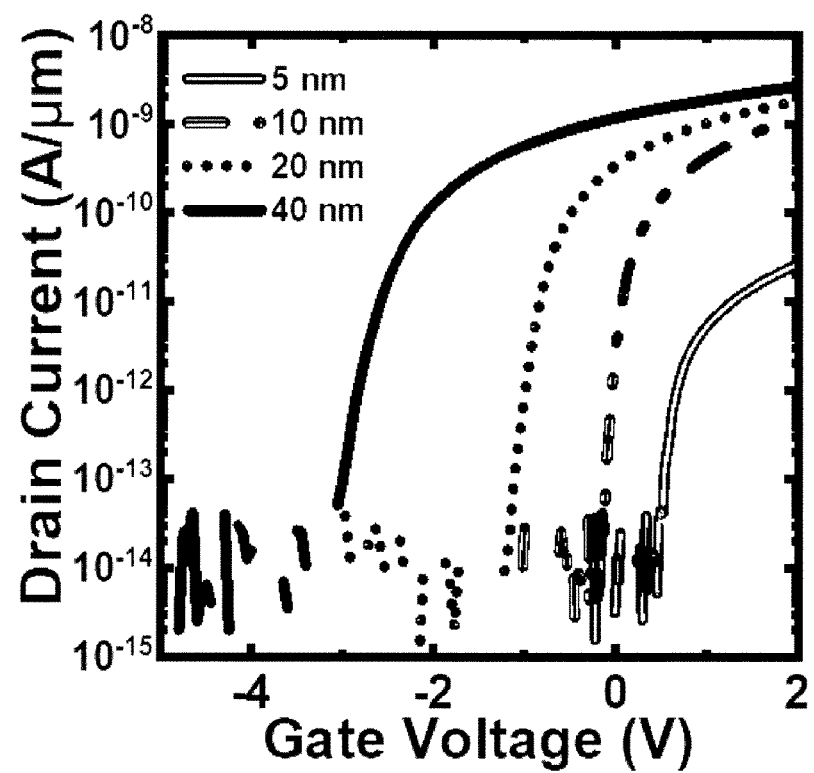
FIG. 3 is a diagram showing a dependency of Id-Vg characteristics on a thickness of a channel layer in a transistor using an IGZO film as the channel layer.
Figure 4:
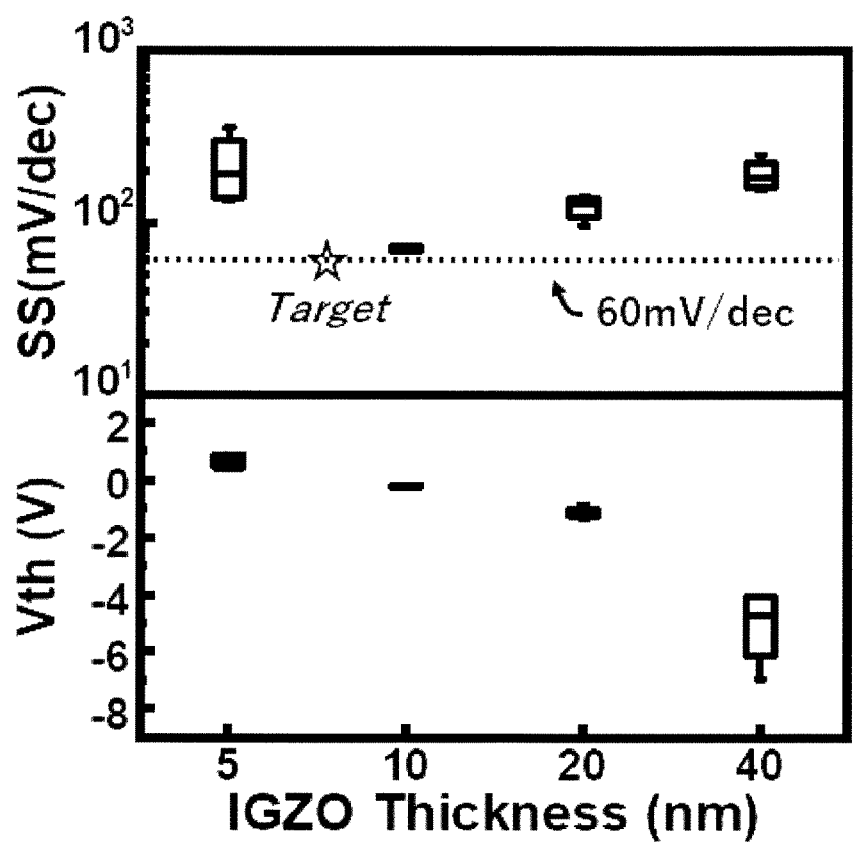
FIG. 4 is a diagram showing a threshold voltage (Vth) and a subthreshold swing (SS) obtained from Id-Vg characteristics shown in FIG. 3.

The inventors have investigated the dependency on the thickness of the IGZO film for transistor characteristics in the case where the IGZO film is used as the channel layer. FIG. 3 is a diagram showing a dependency of Id-Vg characteristics on a thickness of a channel layer in the transistor using an IGZO film as the channel layer. Curves shown in FIG. 3 are the Id-Vg characteristics of the transistor using a silicon dioxide film as the gate insulating layer and the IGZO film as the channel layer. In this case, a source-drain voltage (Vds) was set to 50 mV. The thickness of the IGZO film was set at 5 nm, 10 nm, 20 nm, and 40 nm. FIG. 4 is a diagram showing a threshold voltage (Vth) and a subthreshold swing (SS) obtained from the Id-Vg characteristics shown in FIG. 3.

As shown in FIG. 3 and FIG. 4, as the thickness of the IGZO film decreased, the transistor characteristics changed. Specifically, as shown in FIG. 4, as the film thickness of IGZO film decreases, the threshold voltage changed from negative to positive, and the subthreshold swing tended to gradually decrease. In the case where the thickness was 5 nm, although the Id-Vg characteristics and the subthreshold swing deteriorated, the inventors consider that it is highly likely that normal transistor characteristics could not be obtained due to some factor.

Theoretically, it is known that an ideal subthreshold swing at room temperature is 60 mV/dec. That is, it can be said that the thickness of the IGZO film when the subthreshold swing is 60 mV/dec is suitable as the thickness of the channel layer. According to the results shown in FIG. 4, it was found that the ideal subthreshold swing was obtained when the thickness of the IGZO film was less than 10 nm (preferably 8 nm or less). Based on the above results, the non-volatile memory element 100 of the present embodiment has a thickness of the channel layer 140 of less than 10 nm (preferably 8 nm or less, more preferably 6 nm or less).

Figure 5:
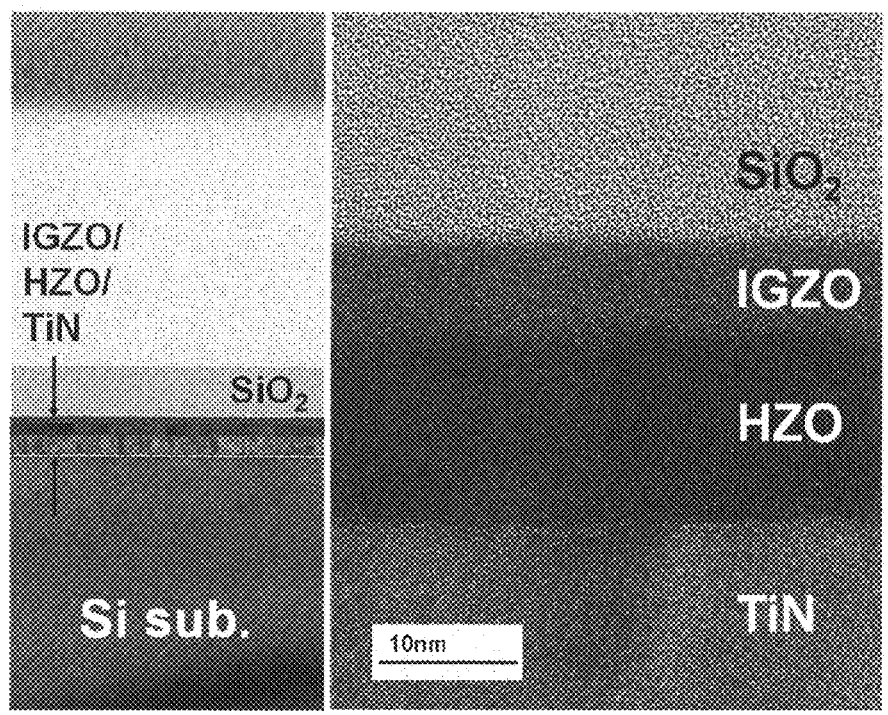
FIG. 5 is an enlarged TEM photograph of a channel portion in a non-volatile memory element of the present embodiment.

FIG. 5 is an enlarged TEM photograph of a channel portion in the non-volatile memory element 100 of the present embodiment. In the channel portion of the non-volatile memory device 100, the first gate electrode (TiN film) 120, the gate insulating layer (HZO film) 130, the channel layer (IGZO film) 140, and the protective insulating layer (SiO$_2$ film) 150 are stacked in this order. As shown in FIG. 5, each layer is formed with high uniformity. From the photograph shown in FIG. 5, it can be seen that the HZO film is crystallized. On the other hand, the IGZO film is amorphous. In addition, it can be seen that an interface layer having low dielectric constant is not formed between the HZO film and the IGZO film. The contact of the IGZO film as the channel layer 140 contributes to the uniformity and crystallinity of the ferroelectric layer (specifically, the HZO film), which is the gate insulating layer 130.

Figure 6:
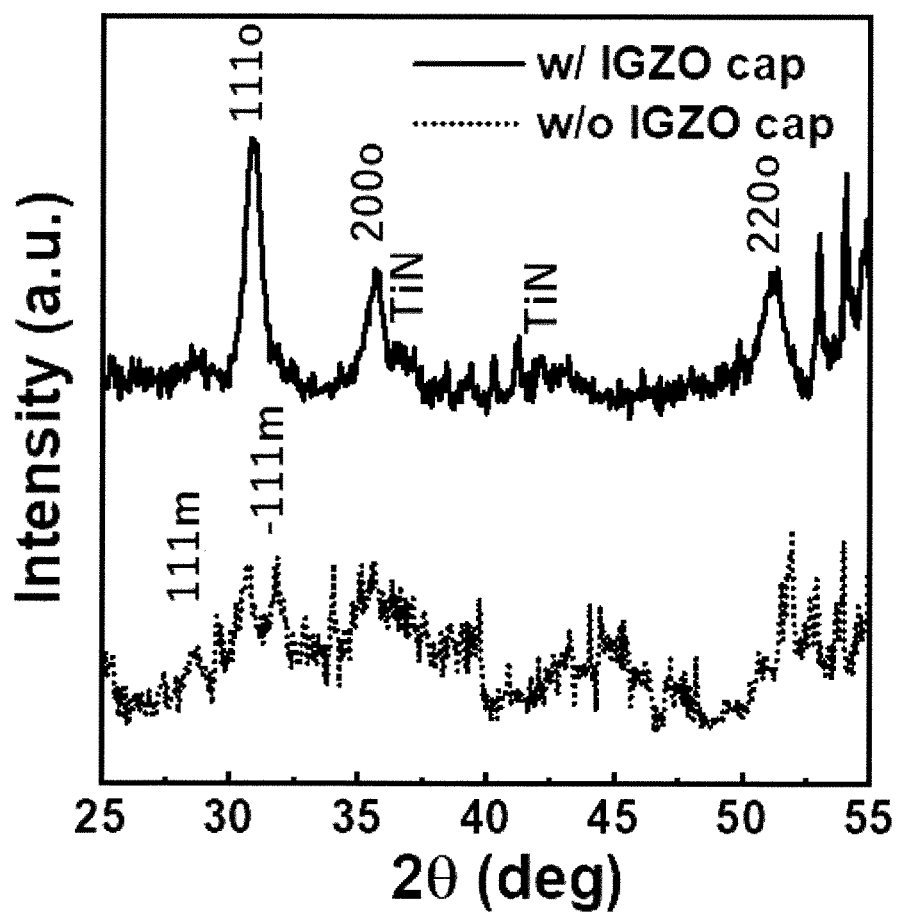
FIG. 6 is a diagram showing a result of GI-XRD measurement with respect to an HZO film after crystallization.

FIG. 6 is a diagram showing a result of GI-XRD (Grazing Incidence X-Ray Diffraction) measurement in the HZO film after crystallization. Specifically, FIG. 6 shows measurement spectrums comparing the case where a crystallization annealing is performed after the IGZO film is provided as a cap film on the HZO film and the case where the crystallization annealing is performed without providing the IGZO film. As shown in FIG. 6, in the case where the IGZO film is provided as the cap film, peaks (e.g., "111o" or the like) indicating that an orthorhombic crystal is formed in the HZO film appear. It is known that the HZO film shows ferroelectricity when the orthorhombic crystal is formed in the film and that it does not show ferroelectricity in the monoclinic crystal. Therefore, according to the measurement spectrum in FIG. 6, it can be seen that capping by the IGZO film effectively contributes to forming the ferroelectric layer comprising the HZO film.

Figure 7:
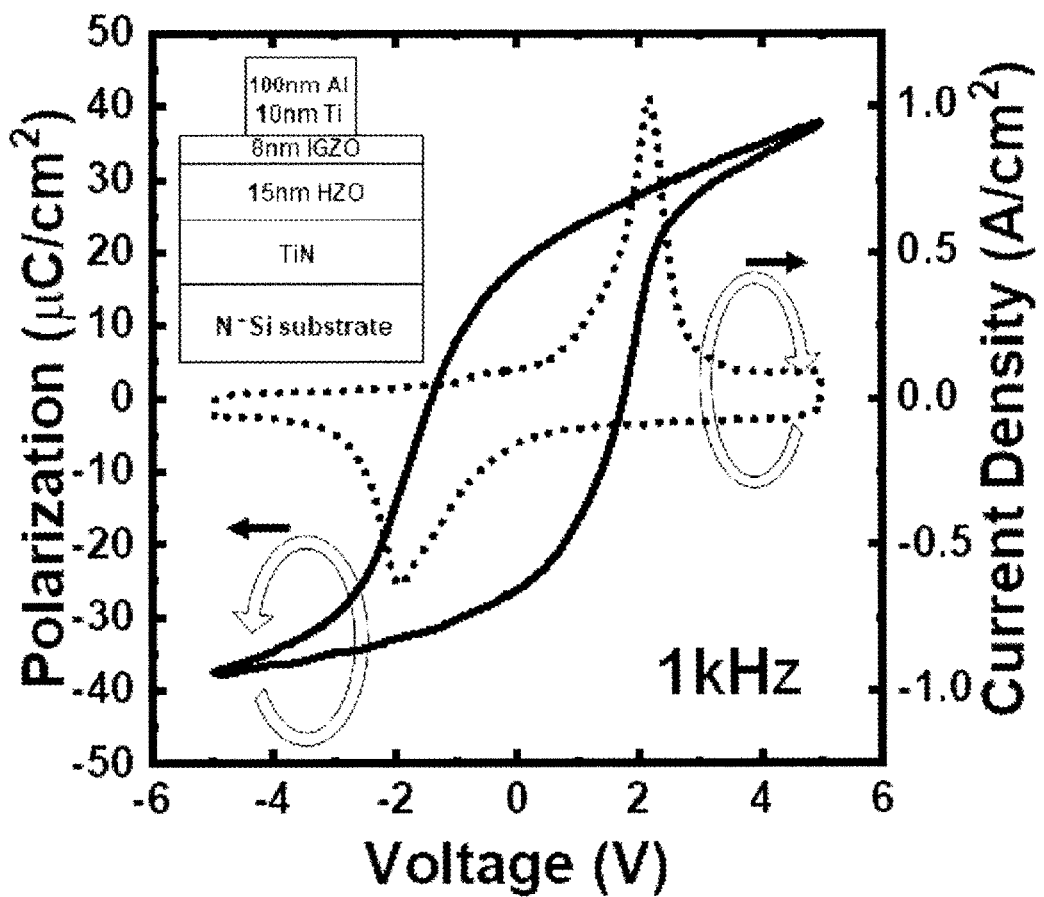
FIG. 7 is a diagram showing P-V characteristics and I-V characteristics of a capacitor using an HZO film as a dielectric.

FIG. 7 is a diagram showing P-V characteristics and I-V characteristics of a capacitor using the HZO film as a dielectric. Specifically, FIG. 7 shows the P-V characteristics and the I-V characteristics measured by a measurement frequency of 1 kHz using a capacitor with a stacked structure composed of Al film/Ti film/IGZO film/HZO film/TiN film. As shown in FIG. 7, in the measurement results, hysteresis characteristics of a good ferroelectric and an inversion current due to spontaneous polarization were observed. This means that the stacked structure described above can exhibit good characteristics as a ferroelectric capacitor.

Figure 8:
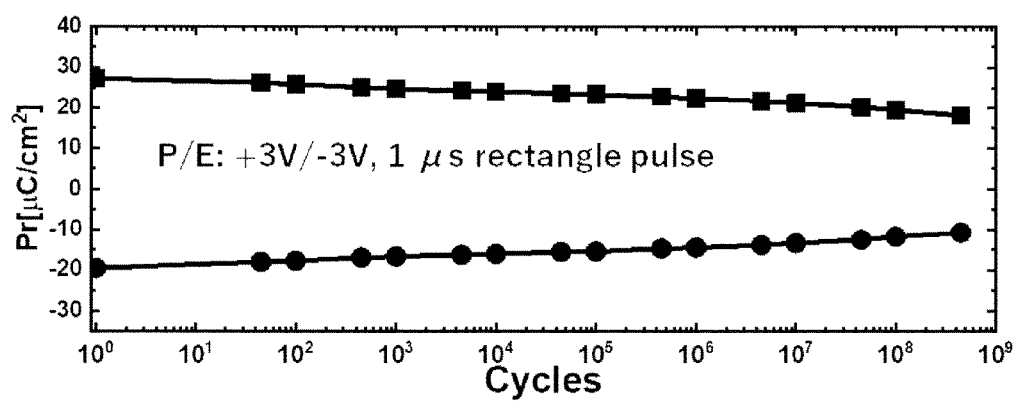
FIG. 8 is a diagram showing rewrite endurance of a capacitor using an HZO film as a dielectric.

FIG. 8 is a diagram showing rewrite endurance of a capacitor using an HZO film as a dielectric (specifically, a capacitor having the structure shown in FIG. 7). In this case, the horizontal axis is a stress cycle, and the vertical axis is a residual polarization. In a rewrite endurance test, a square wave voltage whose amplitude was modulated between −3 V and +3 V was applied to the capacitor in a period of 1 microsecond. Points indicated by square dots are residual polarizations after writing data "0" by applying a positive voltage to the capacitor, and points indicated by round dots are residual polarizations after writing data "1" by applying a negative voltage to the capacitor. As shown in FIG. 8, it was found that the capacitor using the HZO film as a dielectric exhibited stable write characteristics up to about 1×10$^9$ times. Thus, it can be said that the capacitor composed of the stacked structure described above is a highly reliable capacitor with suppressed degradation.

FIG. 5 (b) in "Karine Florent, "Reliability Study of Ferroelectric Al:HfO$_2$ Thin Films for DRAM and NAND Applications", Aug. 31, 2017, IEEE Transactions on Electron Devices, Volume 64, Page (s): 4091-4098, (2017)" shows measurement results showing a rewrite endurance of a SIS-structured capacitor using a polysilicon film and an Al:HfO$_2$ film. In this case, for example, according to the measurement result with a voltage of 3 V, when the number of writes reaches about 10$^3$ times, there is a degradation, and finally it breaks down at about 10$^5$ times. That is, it can be seen that the maximum number of writes of the capacitor composed of the hafnium oxide film and the polysilicon film is equal to or less than three orders of magnitude compared to that of the capacitor composed of the hafnium oxide film and the IGZO film. This result also shows the advantage of using the IGZO film instead of the polysilicon film as the channel layer of the FeFET.

Figure 9:
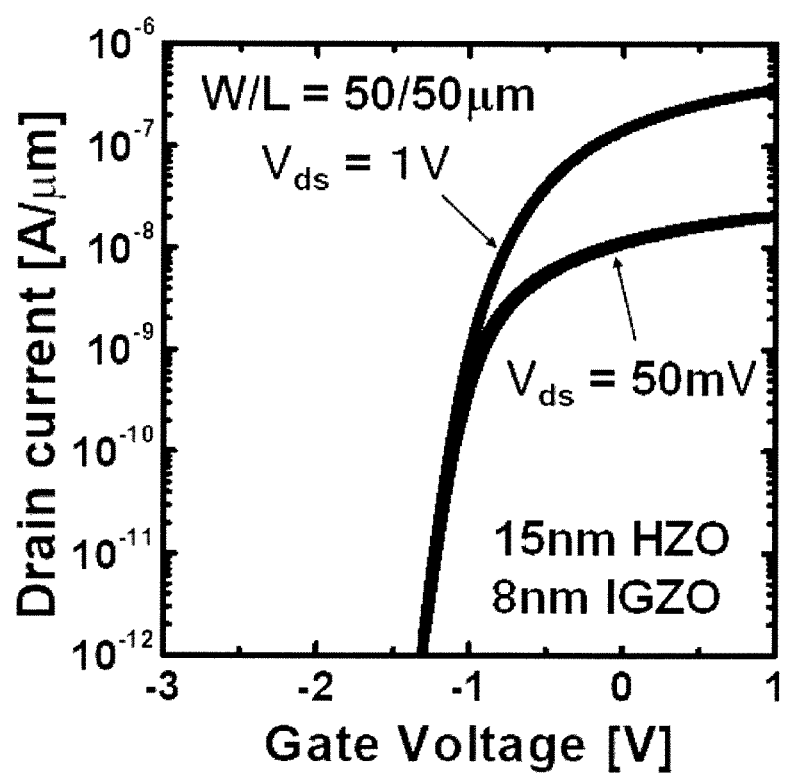
FIG. 9 is a diagram showing Id-Vg characteristics measured using the non-volatile memory device of the first embodiment.

Next, FIG. 9 is a diagram showing Id-Vg characteristics measured using the non-volatile memory device 100 of the first embodiment. The characteristics shown in FIG. 9 have a channel width (W) and a channel length (L) of 50 μm. The source-drain voltage (Vds) was measured separately for the case of 50 mV and the case of 1 V. A source-gate voltage (hereinafter referred to as "gate voltage") (Vg) was swept to the extent that erase/program operations did not occur. As a result, as shown in FIG. 9, almost ideal characteristics of the junctionless FET were obtained.

Figure 10:
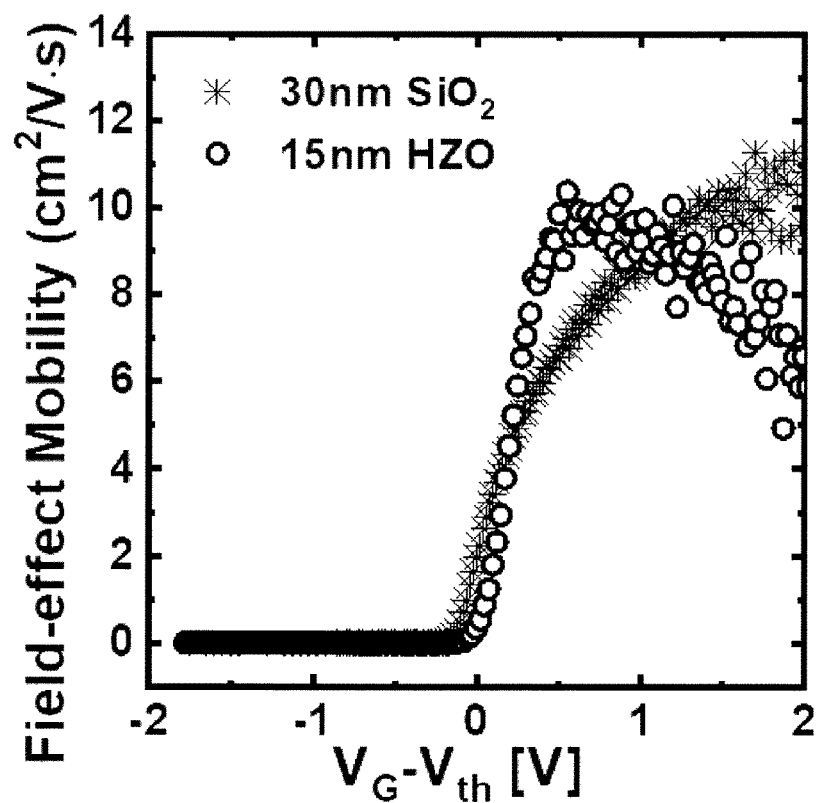
FIG. 10 is a diagram showing a field-effect mobility obtained from Id-Vg characteristics shown in FIG. 9.

FIG. 10 is a diagram showing a field-effect mobility obtained from Id-Vg characteristics shown in FIG. 9. The case where a silicon oxide film with a thickness of 30 nm is used as the gate insulating layer is also shown. As shown in FIG. 10, there were no large differences in the field-effect mobility between the case where the HZO film with a thickness of 15 nm is used as the gate insulating layer and the case where the silicon oxide film with a thickness of 30 nm is used as the gate insulating layer, and values of about 10 cm$^2$/Vs were obtained in both cases. The value of 10 cm$^2$/Vs is consistent with a hole mobility of the IGZO film. This result means that the non-volatile memory device 100 of the present embodiment is operated by bulk conduction. That is, it has been confirmed that the non-volatile memory device 100 of the present embodiment is operated as a substantially ideal junctionless FET.

As described above, according to the measurement results shown in FIG. 7 to FIG. 10, it was supported that the non-volatile memory element 100 of the present embodiment exhibits good characteristics as the ferroelectric capacitor and the field effect transistor.

Figure 11:
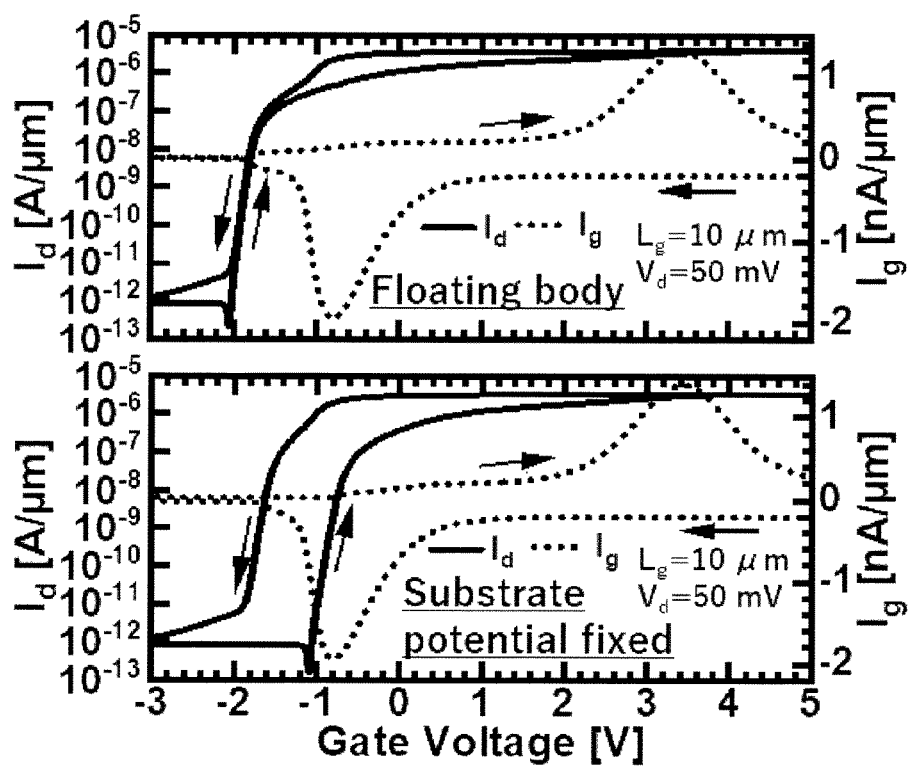
FIG. 11 is a diagram showing simulation results of Id-Vg characteristics and Ig-Vg characteristics of an FeFET using an IGZO film as a channel layer.

Next, FIG. 11 is a diagram showing simulation results of Id-Vg characteristics and Ig-Vg characteristics of an FeFET using an IGZO film as the channel layer. In particular, the characteristic shown in the upper diagram in FIG. 11 is the result in the case where the body potential (i.e., the potential of the channel portion) is not fixed. That is, in the upper diagram, the body potential is in a floating state. The characteristic shown in the lower diagram is the result in the case where the body potential is fixed. That is, in the lower diagram, the body potential is fixed at a constant potential (0V in the present embodiment) by the back gate electrode. In the simulation, a channel length (Lg) was set to 10 μm, and a source-drain voltage (Vd) was set to 50 mV.

According to the simulation result of the Id-Vg characteristics shown in FIG. 11, no memory window (MW) was confirmed when the body potential is in the floating state. However, in the case where the body potential was fixed at a constant potential, a memory window with a sufficient width could be confirmed. That is, in the non-volatile memory element 100 of the present embodiment, it was confirmed that the fixing of the body potential greatly affects the stable formation of the memory window.

Based on the above simulation results, as shown in FIG. 1, the non-volatile memory element 100 of the present embodiment has a configuration in which the second gate electrode 160 is provided as the back gate electrode. Specifically, the non-volatile memory element 100 has a configuration in which the body potential of the channel portion is fixed to the FeFET composed of the first gate electrode 120, the gate insulating layer 130, and the channel layer 140 with the second gate electrode 160.

Figure 12:
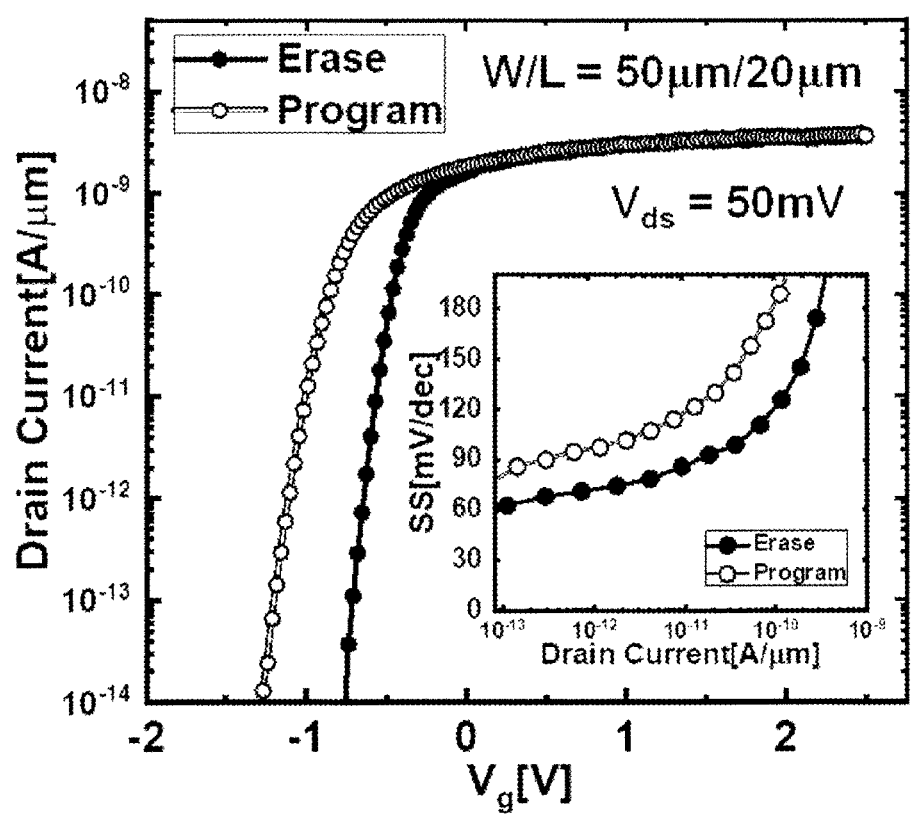
FIG. 12 is a diagram showing Id-Vg characteristics after erase/program operations in the non-volatile memory device of the first embodiment.

FIG. 12 is a diagram showing Id-Vg characteristics after erase/program operations in the non-volatile memory device 100 of the present embodiment. Specifically, FIG. 12 shows the Id-Vg characteristic after the erase operation by supplying Vg=−3 V as the gate voltage of the first gate electrode 120, and the Id-Vg characteristic after the program operation at Vg=+2.5 V. In FIG. 12, the channel width was 50 μm and the channel length was 20 μm. The source-drain voltage (Vds) is 50 mV. The body potential of the channel portion was fixed using the second gate electrode 160. The subthreshold swing in the erased state and the programmed state are also shown in the graph.

As shown in FIG. 12, it was confirmed that the non-volatile memory element 100 normally transitions to two states, i.e., the erased state and the programmed state. The memory window at that time was about 0.5 V. These results are generally as expected from the simulation results. It has also been confirmed that substantially ideal subthreshold swing is obtained in both the erased and programmed states.

Figure 13:
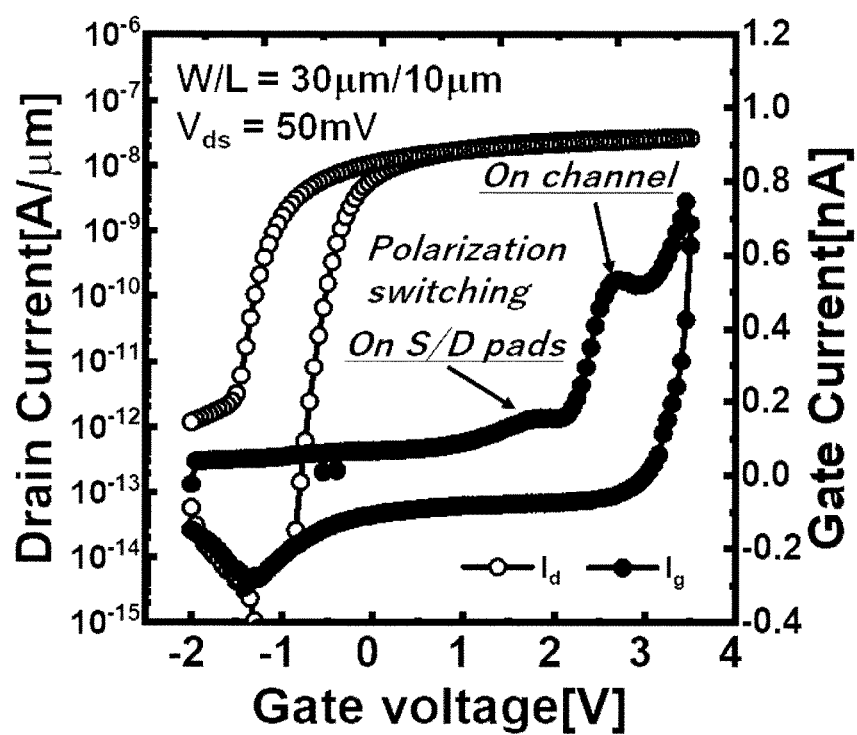
FIG. 13 is a diagram showing Id-Vg characteristics and Ig-Vg characteristics in the non-volatile memory device of the first embodiment.

FIG. 13 is a diagram showing Id-Vg characteristics and Ig-Vg characteristics in the non-volatile memory device 100 of the present embodiment. Specifically, FIG. 13 shows Id-Vg characteristics and Ig-Vg characteristics in the case where the gate voltage of the first gate electrode 120 is swept in a wide range from −2 V to +3.5 V. The channel width was 30 μm and the channel length was 10 μm. The source-drain voltage (Vds) is 50 mV. The body potential of the channel portion was fixed using the second gate electrode 160.

As shown in FIG. 13, hysteresis characteristics due to the ferroelectric were observed in the Id-Vg characteristics. In addition, a peak current due to an inversion of a spontaneous polarization of the ferroelectric was observed in the Ig-Vg characteristics. Specifically, in FIG. 13, two peak currents appear during the positive voltage sweep after the erase operation.

The peak current observed at the lower voltage is a polarization current observed between the first gate electrode 120 and the source electrode 170, and between the first gate electrode 120 and the drain electrode 180. The peak current observed at the higher voltage is a polarization current observed between the first gate electrode 120 and the channel layer 140. This polarization current is due to the spontaneous polarization of the ferroelectric (the gate insulating layer 130). These two peak currents are observed in overlapping in the negative voltage sweep after the program operation.

The result shown in FIG. 13 is generally consistent with the simulation result shown in FIG. 11, which supports that the non-volatile memory element 100 of the present embodiment is normally operated as a ferroelectric memory.

Figure 14:
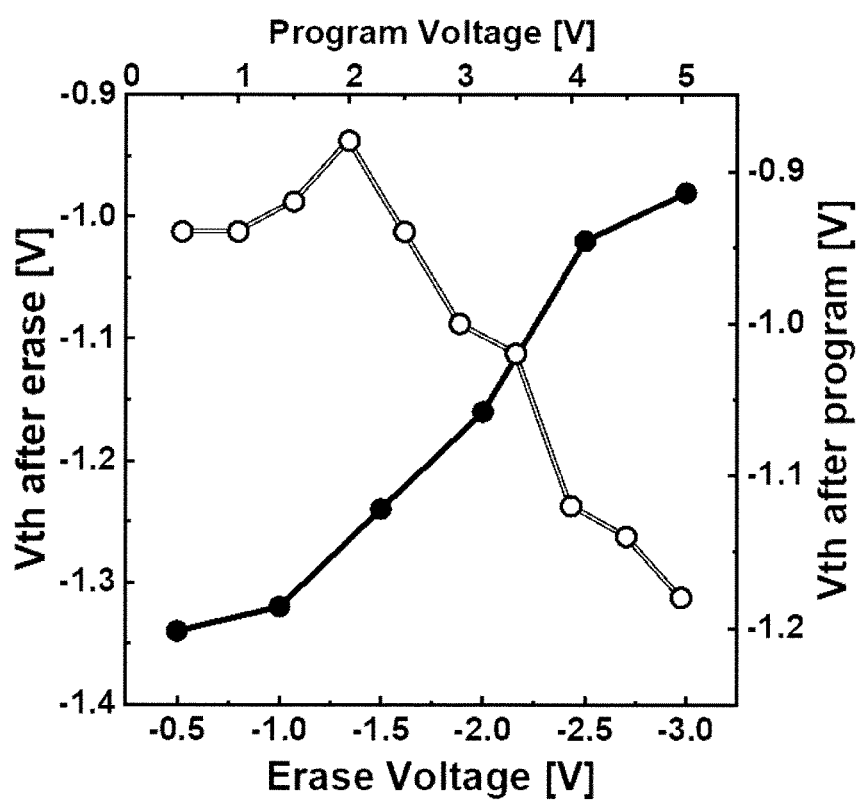
FIG. 14 is a diagram showing a dependency of a threshold voltage on a write voltage in the non-volatile memory element of the first embodiment.

FIG. 14 is a diagram showing a dependency of a threshold voltage on a write voltage (erase voltage and program voltage) in the non-volatile memory element 100 of the first embodiment. According to the graph shown in FIG. 14, it can be seen that the erase voltage (indicated by black circles) can be controllable substantially linearly in a range of −0.5 V to −3.0 V. It can also be seen that the program voltage (indicated by open circles) can be controlled substantially linearly in a range of 2.0 V to 5.0 V. From the above, it can be said that the non-volatile memory element 100 of the present embodiment can be controlled with a write voltage of 5.0 V or less. Therefore, the non-volatile memory element 100 of the present embodiment can be operated using a 5 V power source used in a common integrated circuit and has a very high affinity for existing integrated circuits.

As described above, the non-volatile memory element 100 of the present embodiment has a structure in which the IGZO film with a thickness of less than 10 nm is used as the channel layer 140 and the HZO film is used as the gate insulating layer 130. The non-volatile memory element 100 of the present embodiment realizes higher reliability than a conventional non-volatile memory element using a polysilicon film as a channel layer by using the IGZO film as the channel layer 140.

As described above, since the non-volatile memory element 100 of the present embodiment can control the erase/program operations at a voltage of 5.0 V or less, it is possible to be operated at a low voltage and to suppress power consumption. On the other hand, in the conventional flash memory, a high voltage needs to be applied to transfer charges between a substrate and a floating gate via a tunnel oxide layer. As a result, the flash memory has a demerit that a boosting circuit for generating a high voltage is required.

Furthermore, the non-volatile memory element 100 of the present embodiment can secure a good memory window by fixing the body potential of the channel portion using the second gate electrode 160. Therefore, according to the present embodiment, it is possible to obtain the non-volatile memory element 100 that can be operated at a low voltage (e.g., a voltage between the source and the drain is 50 mV or less), has low power consumption, and has high reliability.

In the present embodiment, although an example of fixing the body potential at a constant potential by using the second gate electrode 160 has been shown, the present invention is not limited to this, it is also possible to assist the program operation and the erase operation by making the potential of the second gate electrode 160 variable.

A width of the memory window described above is affected by an electric field strength formed in the channel layer 140 and the gate insulating layer 130. That is, the width of the memory window varies depending on the thickness of the protective insulating layer 150 that insulates and separates the channel layer 140 and the second gate electrode 160.

Figure 15A:
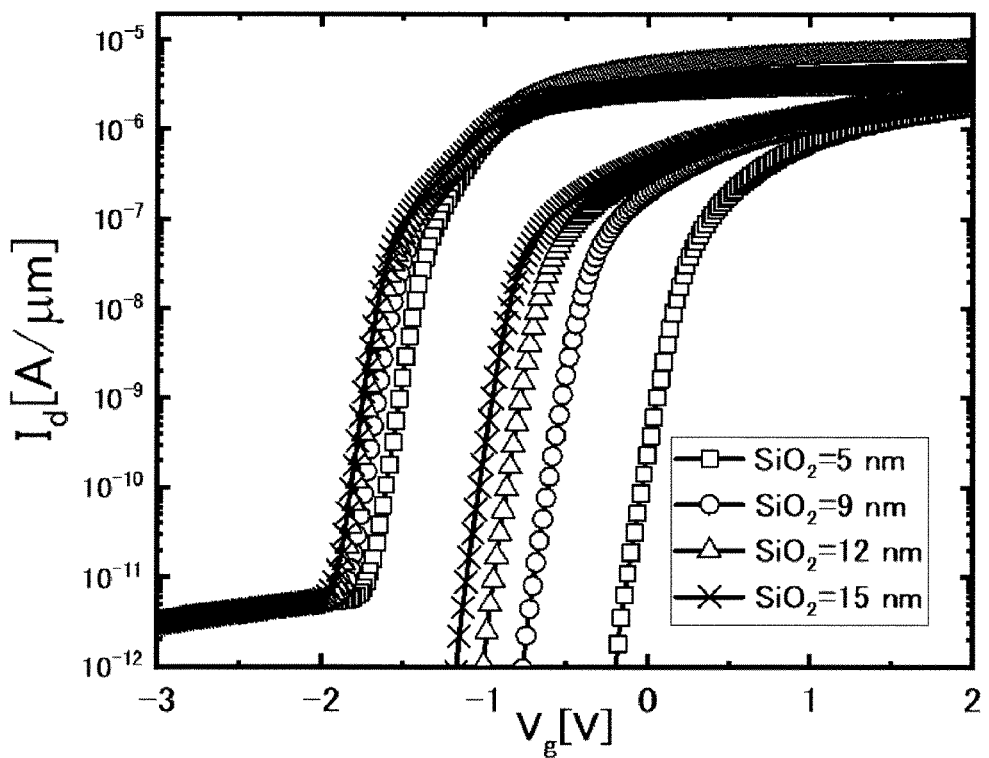
FIG. 15A and FIG. 15B are diagrams showing a dependency of a memory window on a thickness of a protective insulating layer in the non-volatile memory device of the first embodiment.
Figure 15B:
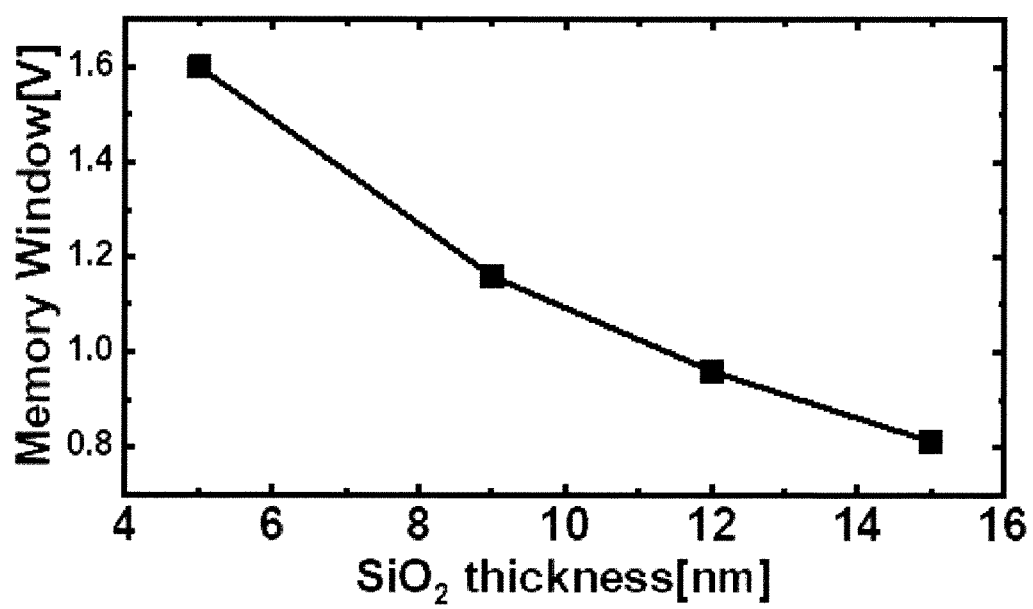

FIG. 15A and FIG. 15B are diagrams showing the dependency of the memory window on the thickness of the protective insulating layer 150 in the non-volatile memory device 100 of the present embodiment. In this example, a thickness of the gate insulating layer 130 is 15 nm, and a thickness of the channel layer 140 is 8 nm. The thickness of the protective insulating layer 150 was set to 5 nm, 9 nm, 12 nm, and 15 nm.

As shown in FIG. 15A, it was observed that the threshold voltage after the erase operation tends to increase as the thickness of the protective insulating layer 150 decreases. That is, as shown in FIG. 15B, it was found that the Id-Vg characteristics change in a direction in which the width of the memory window increases as the thickness of the protective insulating layer 150 decreases.

According to the results shown in FIG. 15B, in the case where the thickness of the protective insulating layer 150 is 15 nm or less, a width of 0.8 V or more can be secured as the width of the memory window. That is, the thickness of the protective insulating layer 150 is preferably thin. However, according to the findings of the inventors, since a leakage current decreases as the thickness of the protective insulating layer 150 increases, the thickness of the protective insulating layer 150 is preferably thick from the viewpoint of ensuring the reliability of the memory operation. From the above, in order to sufficiently secure the width of the memory window while suppressing the leakage current, it can be said that the thickness of the protective insulating layer 150 is preferably 8 nm or more and 15 nm or less (more preferably 11 nm or more and 13 nm or less). The thickness of the channel layer 140 and the thickness of the protective insulating layer 150 are considered to be closely related with respect to the electric field forming to the channel portion. Therefore, in the non-volatile memory device 100 of the present embodiment, the ratio of the thickness of the protective insulating layer 150 to the thickness of the channel layer 140 is set to 1.0 or more and 1.8 or less (preferably 1.4 or more and 1.6 or less).

Figure 23A:
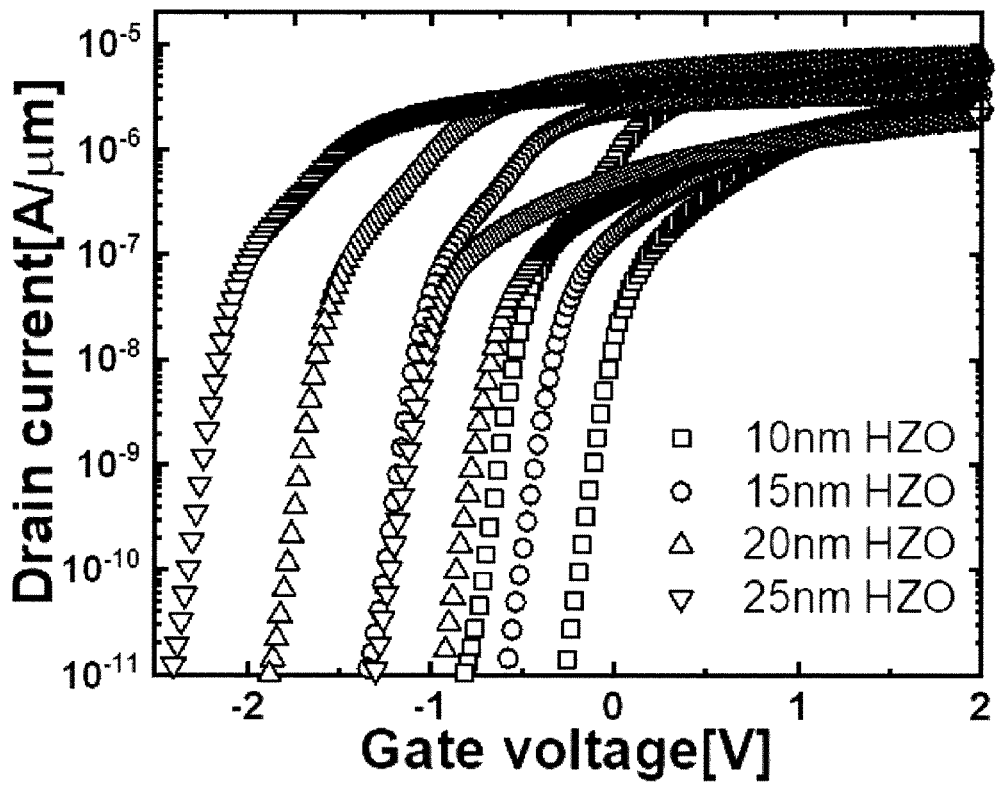
FIG. 23A and FIG. 23B are diagrams showing a dependency of a memory window on a thickness of a gate insulating layer in the non-volatile memory device of the first embodiment.
Figure 23B:
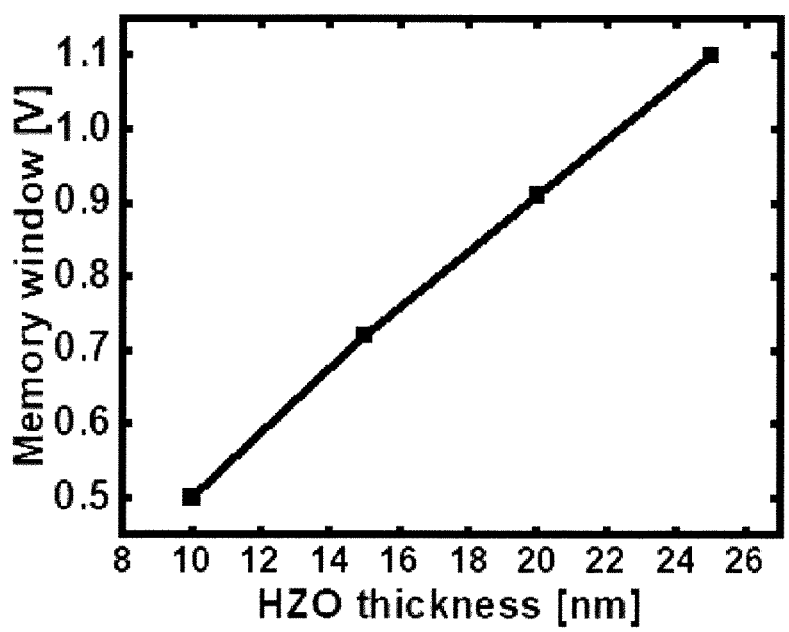

FIG. 23A and FIG. 23B are diagrams showing the dependency of the memory window on the thickness of the gate insulating layer 130 in the non-volatile memory element 100 of the present embodiment. In this example, the thickness of the protective insulating layer 150 is 12 nm and the thickness of the channel layer 140 is 8 nm. The channel length is 10 µm. The thickness of the gate insulating layer 130 is 10 nm, 15 nm, 20 nm, and 25 nm.

As shown in FIG. 23A, it was observed that the change in the threshold voltage tends to increase as the thickness of the gate insulating layer 130 increases. That is, as shown in FIG. 23B, it was found that the width of the memory window increases as the thickness of the gate insulating layer 130 increases. The reason for such a property is that if the thickness of the gate insulating layer 130 increases, the polarization will not be inverted within the gate insulating layer 130 unless a larger gate voltage is applied by that amount. Therefore, it is desirable to appropriately design the thickness of the gate insulating layer 130 to obtain an appropriate memory window and threshold voltage.

Figure 24A:
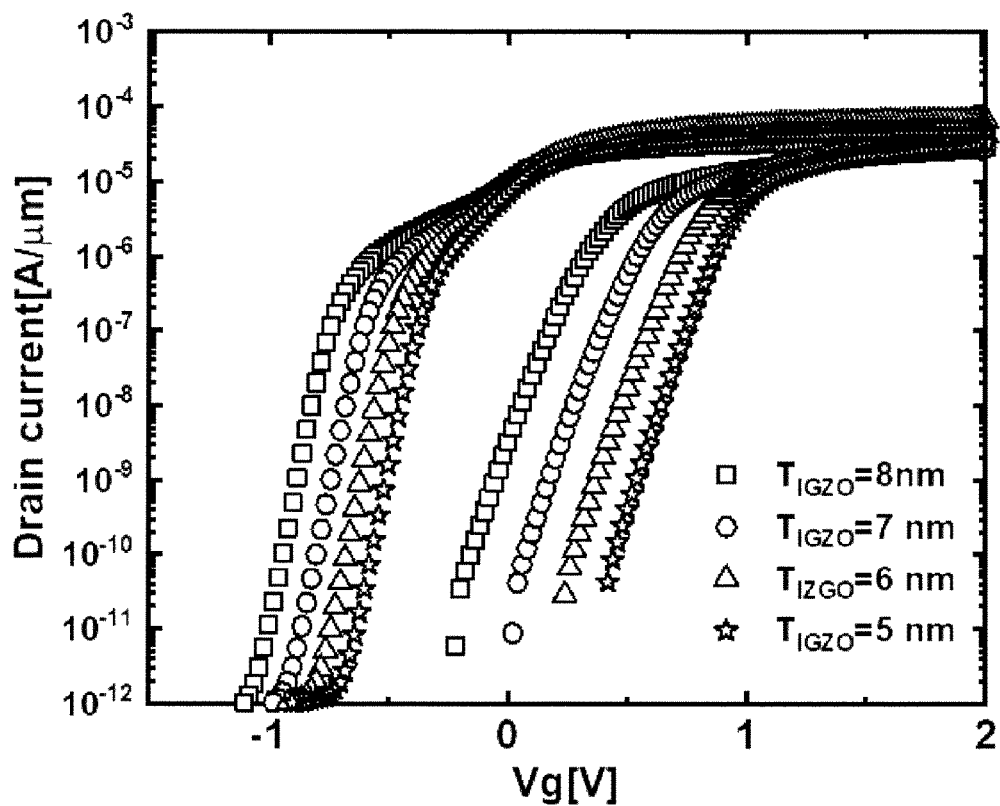
FIG. 24A and FIG. 24B are diagrams showing a dependency of a memory window on a thickness of a channel layer in the non-volatile memory element of the first embodiment.
Figure 24B:
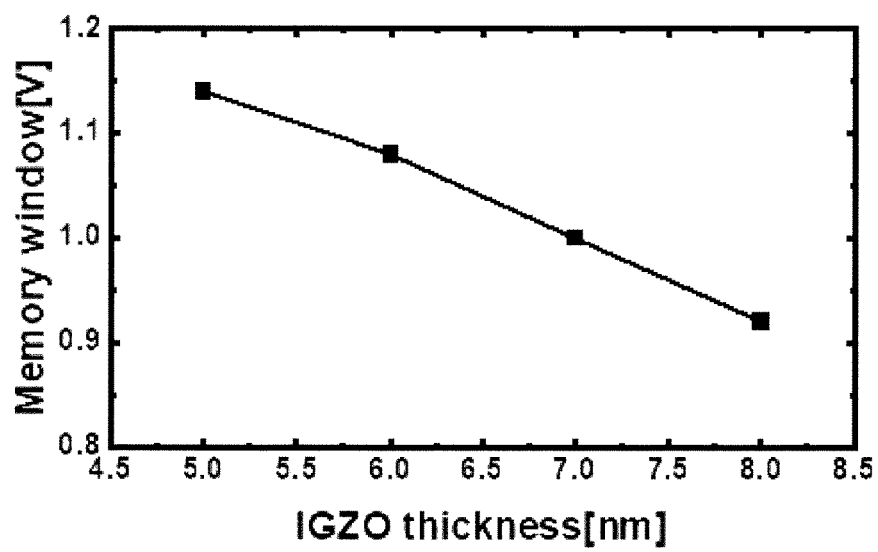

FIG. 24A and FIG. 24B are diagrams showing the dependency of the memory window on the thickness of the channel layer 140 in the non-volatile memory device 100 of the present embodiment. Specifically, FIG. 24A shows simulation results of the Id-Vg characteristics in which the thickness of the channel layer 140 of the non-volatile memory device 100 of the present embodiment is set to 5 nm, 6 nm, 7 nm, or 8 nm. In this example, the thickness of the protective insulating layer 150 is 12 nm. The thickness of the gate insulating layer 130 is 15 nm. The channel length is 10 µm.

According to the results shown in FIG. 24A and FIG. 24B, it was found that the threshold voltage increases in the positive direction and the width of the memory window increases as the thickness of the channel layer 140 decreases. That is, it was found that the non-volatile memory device 100 of the present embodiment can control the width of the memory window by appropriately setting the thickness of the channel layer 140 while securing the memory window using the second gate electrode 160.

Second Embodiment

In the second embodiment, a non-volatile memory element 200 having a structure different from that of the first embodiment will be described. The difference from the first embodiment is that the non-volatile memory element 200 fixes the body potential by shortening the channel length, rather than fixing the body potential using the back gate electrode as in the first embodiment. In the description using the drawings, portions common to those of the first embodiment are denoted by the same symbols as those of the first embodiment, and detailed description thereof may be omitted.

Figure 16:
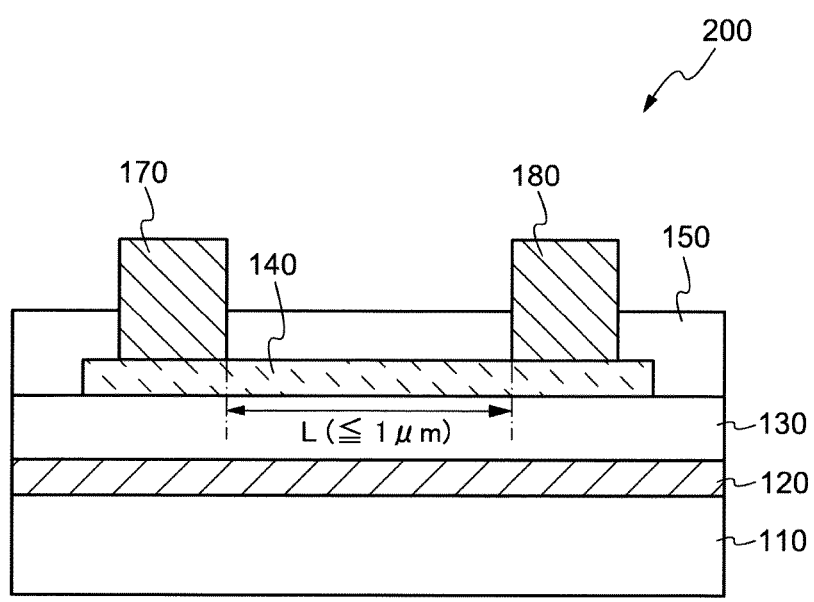
FIG. 16 is a cross-sectional view showing an element structure in a non-volatile memory element of a second embodiment.

FIG. 16 is a cross-sectional view showing an element structure in the non-volatile memory element 200 of the second embodiment. The non-volatile memory element 200 is an FeFET as in the first embodiment. However, a channel length (L) in the non-volatile memory element 200 of the present embodiment is designed to be 1 µm or less. In the present embodiment, a distance between the source electrode 170 and the drain electrode 180 is defined as the channel length. The reason why the channel length of the non-volatile memory element 200 of the present embodiment is 1 µm or less will be described below.

Figure 17:
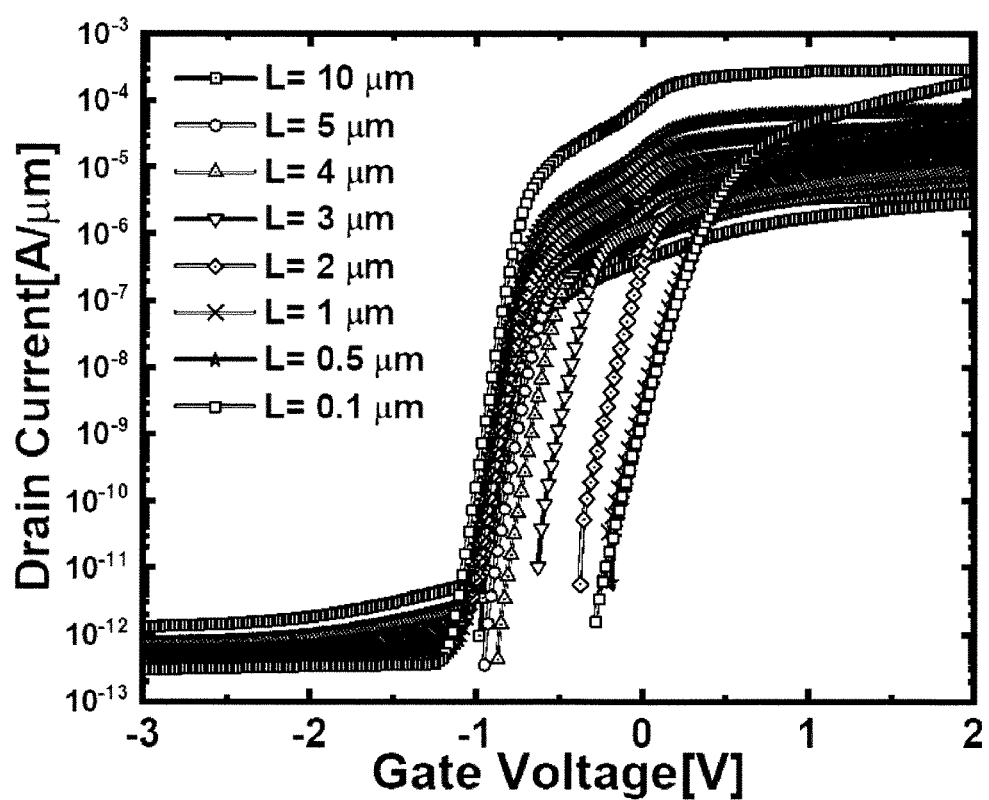
FIG. 17 is a diagram showing a dependency of Id-Vg characteristics on a channel length in a non-volatile memory element using an IGZO film as a channel layer.

FIG. 17 is a diagram showing a dependency of Id-Vg characteristics on the channel length in a non-volatile memory device using an IGZO film as a channel layer. Specifically, the diagram shows Id-Vg characteristics in the case where the channel length (L) of the non-volatile memory device having the structure shown in FIG. 16 (except for the channel length) is 0.1 µm, 0.5 µm, 1 µm, 2 µm, 3 µm, 4 µm, 5 µm, or 10 µm. The source-drain voltage (Vds) was set to 50 mV. The thickness of the IGZO film was set to 8 nm, and the thickness of the HZO film was set to 15 nm.

According to the simulation results, in the case where the channel length was 10 µm, 5 µm, and 4 µm, the memory window is hardly observed, and the memory window was gradually observed from the vicinity where the channel length became 3 µm or less. In the case where the channel length was 1 µm, 0.5 µm, or 0.1 µm, the width of the memory window was almost unchanged. That is, from the result of FIG. 17, it was found that when the channel length was 1 µm or less, the memory window was sufficiently opened, and the width thereof was not changed.

From the above, in the case of the non-volatile memory device having the structure shown in FIG. 16 (except for the channel length), if the channel length is 1 µm or less, a memory window having a sufficient width can be secured without fixing the body potential using the back gate electrode as in the case of the first embodiment. The inventors consider that the reason why a memory window having a sufficient width can be secured when the channel length is set to 1 µm or less is that the body potential is fixed under the influence of a source-side potential and a drain-side potential.

Figure 18:
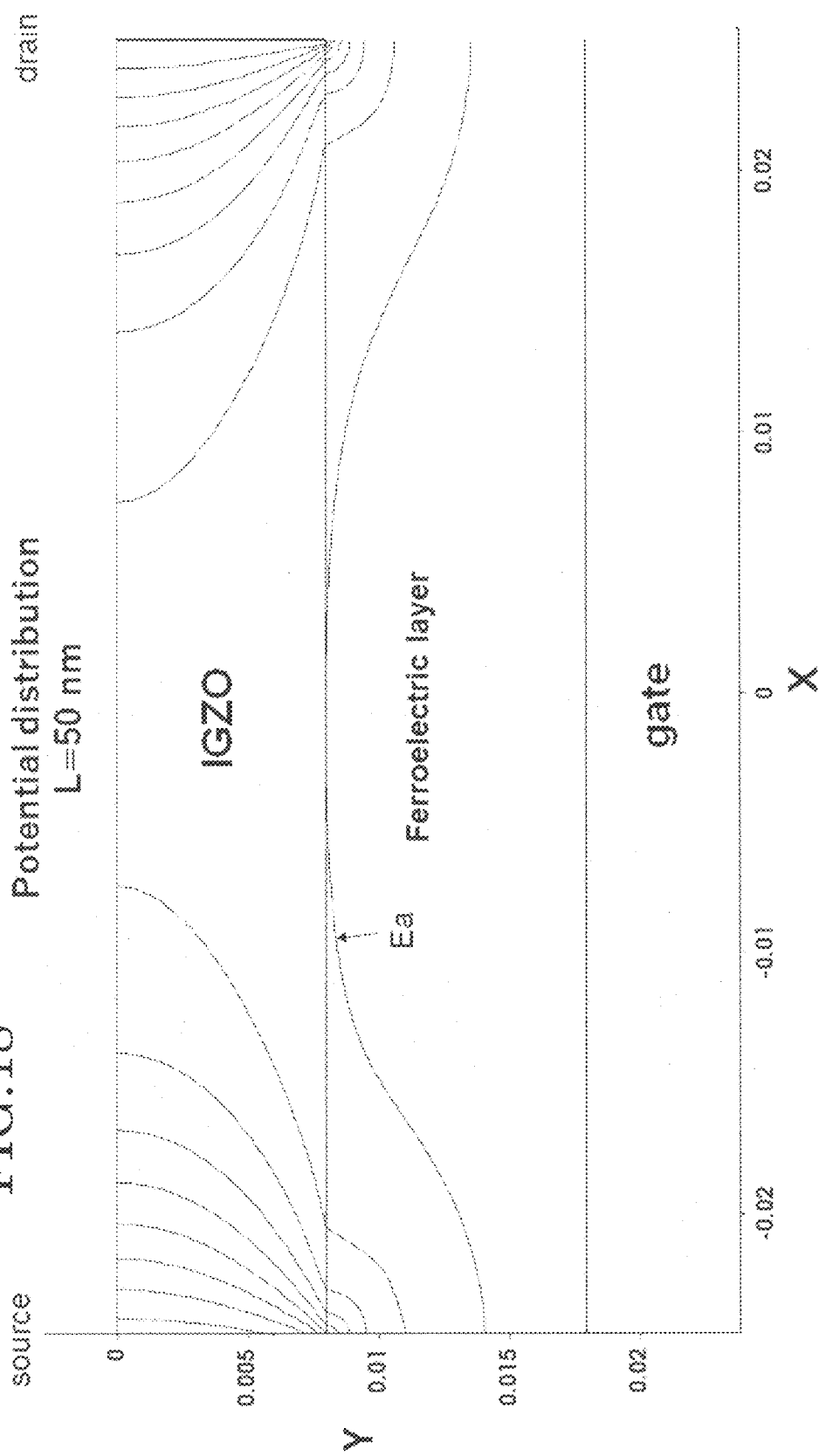
FIG. 18 is a diagram showing a potential distribution inside a channel layer.
Figure 19:
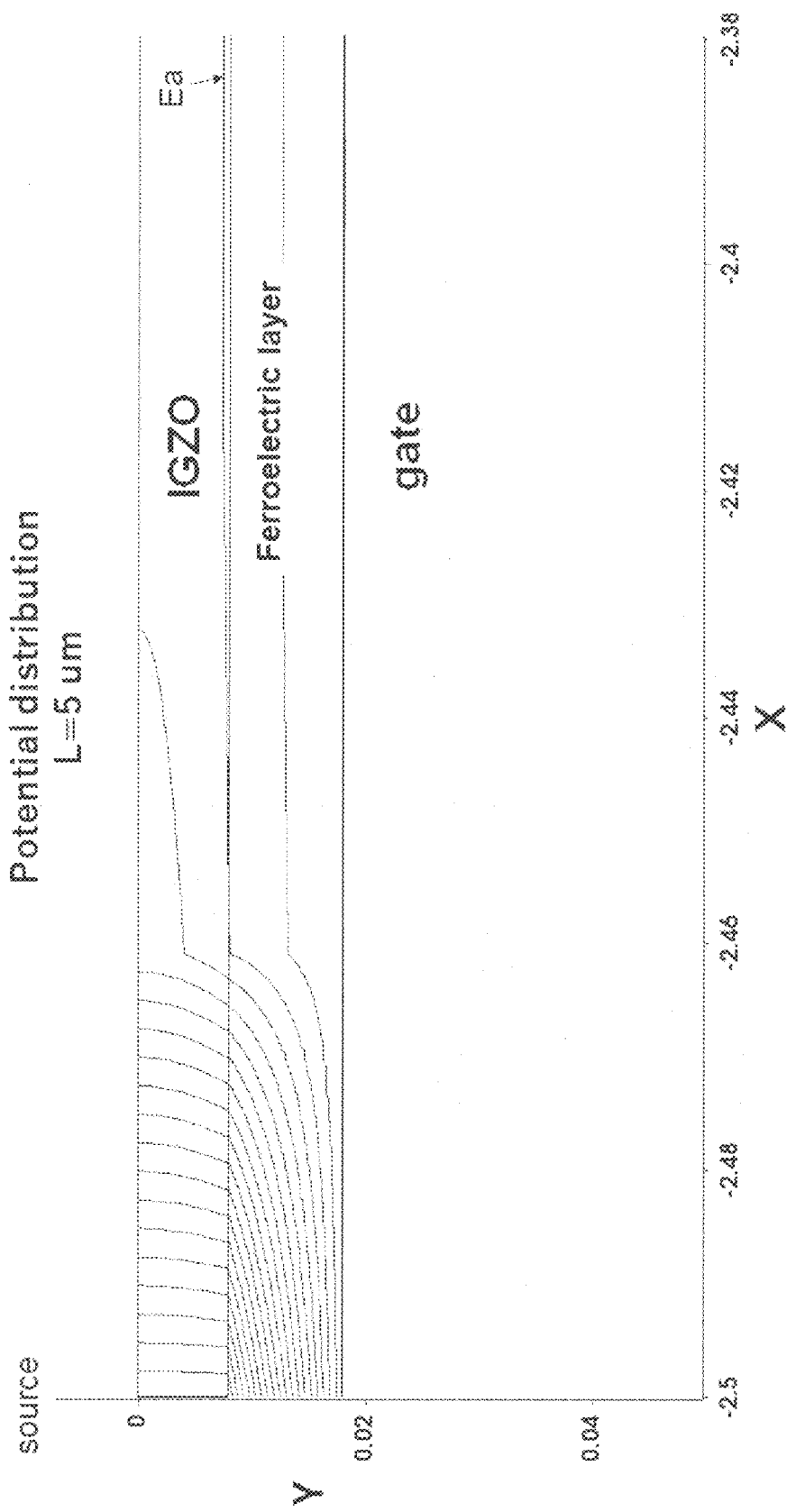
FIG. 19 is a diagram showing a potential distribution inside a channel layer.

FIG. 18 and FIG. 19 are diagrams showing potential distributions inside the channel layer 140 and the gate insulating layer 130. In FIG. 18 and FIG. 19, a horizontal dimension X and a vertical dimension Y are shown in µm units, respectively. The gate potential and the drain potential were calculated as −10 V and 50 mV for a source potential, respectively. FIG. 18 shows the potentials of the ferroelectric layer (HZO film) and the channel layer (IGZO film) in the 1 V step in the case where the channel length is 50 nm. That is, FIG. 18 corresponds to the potential distribution of the non-volatile memory element under the condition that the memory window is opened. On the contrary, FIG. 19 shows the potential of the ferroelectric layer and the channel layer in the 0.5 V step in the case where the channel length is 5 µm. However, in FIG. 19, for convenience of description, a range from the source to 120 nm is illustrated. FIG. 19 corresponds to the potential distribution of the non-volatile memory element under the condition that the memory window is not opened.

The potential in the vicinity of the interface between the ferroelectric layer and the channel layer (the potential represented by "Ea" in FIG. 18 and FIG. 19) will be focused on and described. As shown in FIG. 18, in the case where the channel length is relatively short, the distribution of the potential Ea is strongly affected by the source potential and the drain potential and has a shape as if it was forced to the ferroelectric layer side. On the other hand, as shown in FIG. 19, in the case where the channel length is relatively long, the distribution of the potential Ea has a shape that gradually changes in the channel layer when the distance from the source is some extent or more.

The results shown in FIG. 18 and FIG. 19 imply that when the channel length is 50 nm, the voltage applied to the ferroelectric layer is relatively large compared to when the channel length is 5 µm. That is, when the channel length is 50 nm, the inversion of the spontaneous polarization of the ferroelectric material will be greater and the threshold voltage of the FET will be increased (i.e., the memory window opens). On the other hand, when the channel length is 5 µm, the voltage applied to the ferroelectric layer is relatively small, and the threshold voltage of the FET does not increase (i.e., the memory window does not open).

As described above, from the simulation results of the potential distribution inside the channel layer and the ferroelectric layer, it can be seen that the body potential of the channel portion can be fixed by shortening the channel length. That is, the body potential of the channel portion is coupled to the source and drain potentials by shortening the channel length. As a result, a larger voltage can be applied to the ferroelectric layer (gate insulating layer) and causes a larger inversion of the spontaneous polarization (increasing the threshold voltage).

In FIG. 18 and FIG. 19, although the drain-source voltage is calculated as 50 mV, it is also valid to apply a positive voltage greater than 50 mV as the drain voltage at the erase operation. The body potential of the channel portion can be raised more positively by applying a large positive voltage to the drain voltage. For example, when the non-volatile memory element 200 of the present embodiment is operated, the drain voltage at the time of erasing is preferably 0 V or more and 3.3 V or less, or 0 V or more and 5 V or less. The reason why the upper limit was 3.3 V or 5 V is that it is preferable to set power source voltage as the upper limit in consideration of the ease of circuit design. In the description of this paragraph, "drain-source voltage" refers to a potential difference between the drain potential and the source potential. In the description of this paragraph, "drain voltage" refers to a potential difference between the reference potential and the potential of the drain electrode.

Figure 20:
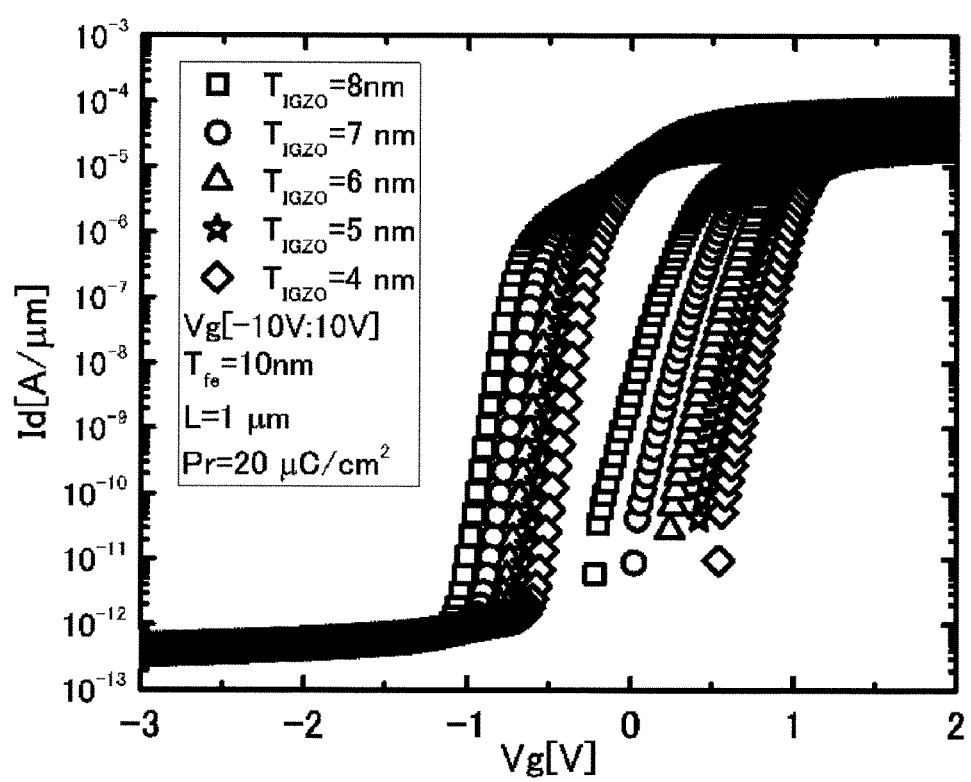
FIG. 20 is a diagram showing a dependency of Id-Vg characteristics on a thickness of a channel layer in the non-volatile memory device of the second embodiment.

FIG. 20 is a diagram showing a dependency of Id-Vg characteristics on a thickness of the channel layer 140 in the non-volatile memory element 200 of the second embodiment. Specifically, FIG. 20 shows simulation results of the Id-Vg characteristics in which the thickness of the channel layer 140 of the non-volatile memory element 200 of the present embodiment was set to 4 nm, 5 nm, 6 nm, 7 nm, or 8 nm. The channel length was fixed to 1 µm. The thickness of the HZO film was set to 10 nm, and the residual polarization (Pr) was set to 20 µC/cm$^2$.

According to the results shown in FIG. 20, as the thickness of the channel layer 140 decreases, the threshold voltage increases in the positive direction, and the width of the memory window increases. That is, in the non-volatile memory element 200 of the present embodiment having a channel length of 1 µm or less, it has been found that setting the thickness of the channel layer 140 to less than 10 nm (preferably, 1 nm or more and 8 nm or less) is very effective in securing a sufficient memory window.

According to the findings of the inventors, the width of the memory window tends to increase even if the spontaneous polarization of the ferroelectric is increased, or the thickness of the ferroelectric is increased. Therefore, the width of the memory window can be controlled to some extent by controlling the spontaneous polarization or thickness of the ferroelectric gate insulating layer 130. However, empirically, since the thickness of the channel layer 140 has the greatest influence on the control of the width of the memory window, it is effective to set the thickness of the channel layer 140 to less than 10 nm as described above.

As described above, the non-volatile memory element 200 of the present embodiment has a structure in which the IGZO film with a thickness of less than 10 nm is used as the channel layer 140 and the HZO film is used as the gate insulating layer 130. Therefore, the non-volatile memory element 200 of the present embodiment has high reliability as in the first embodiment.

In the non-volatile memory element 200 of the present embodiment, by setting the channel length (L) to 1 µm or less, the body potential of the channel portion is fixed by utilizing the source-side potential and the drain-side potential, and a good memory window is secured. Therefore, according to the present embodiment, it is possible to obtain the non-volatile memory element 200 having low power consumption and high reliability as in the first embodiment.

The configuration of the first embodiment can be combined with the configuration of the present embodiment, set the channel length to 1 µm or less, and further provided with a back gate. That is, in the structure shown in FIG. 16, other gate electrodes (not shown) facing the channel layer 140 via the protective insulating layer 150 may be provided as shown in FIG. 1. As a result, the body potential can be fixed more stably.

Figure 25A:
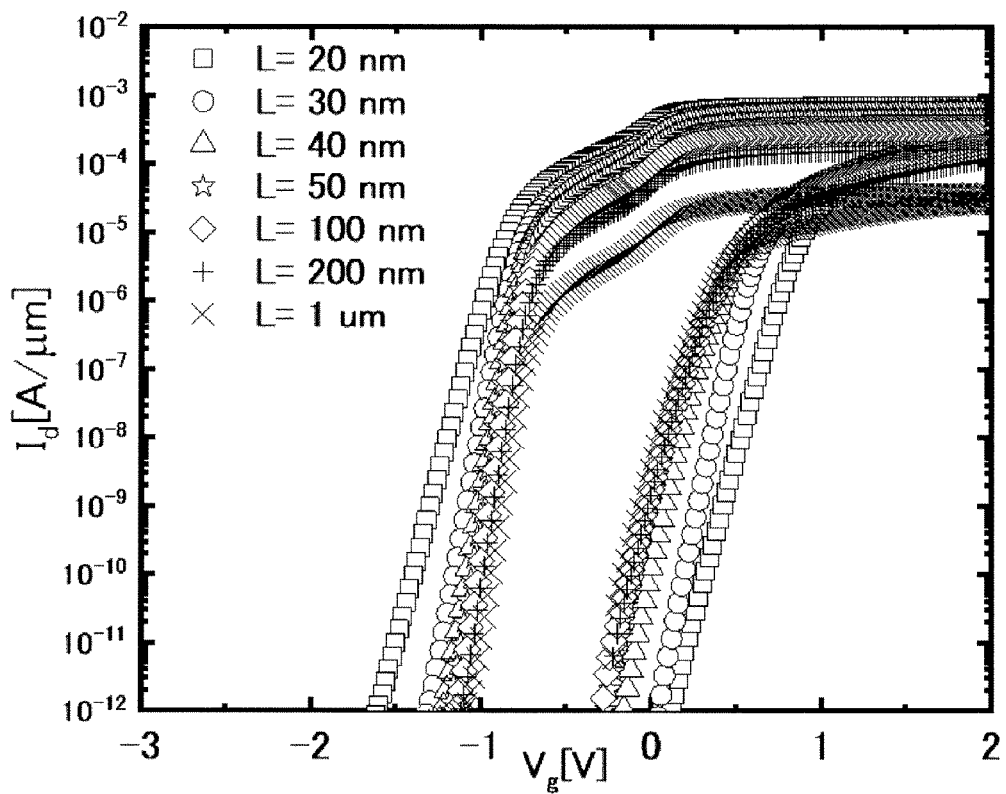
FIG. 25A and FIG. 25B are diagrams showing a dependency of a memory window on a channel length of a channel layer in the non-volatile memory element of the second embodiment.
Figure 25B:
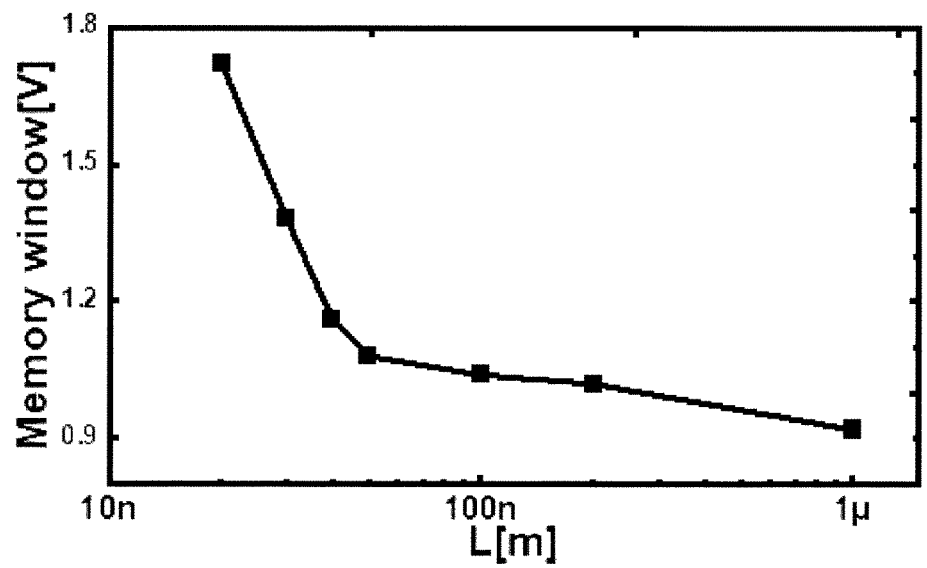

FIG. 25A and FIG. 25B are diagrams showing the dependency of the memory window on the channel length of the channel layer 140 in the non-volatile memory element 200 of the present embodiment. Specifically, FIG. 25A shows a simulation result of Id-Vg characteristics when the channel length (L) of the channel layer 140 of the non-volatile memory element 200 of the present embodiment is set to 20 m, 30 nm, 40 nm, 50 nm, 100 nm, 200 nm, or 1 µm. In this example, the thickness of the gate insulating layer 130 is 15 nm. The thickness of the channel layer 140 is 8 nm.

As shown in FIG. 25A and FIG. 25B, in a range of the channel length from 100 nm to 1 µm, there is no significant change in the width of the memory window. However, in a range where the channel length is 50 nm or less, the width of the memory window tends to increase rapidly. It is considered that this is because when the channel length is 50 nm or less, the influence of the source and drain potentials becomes stronger near the center of the channel, the fluctuation of the potential near the center of the channel becomes large, and the threshold voltage also changes significantly.

If the channel length is greater than 1 µm, although the potential of the channel layer 140 near the source and the drain is affected by the polarization of the gate insulating layer 130, the conductivity of the carrier is limited near the center of the channel. Therefore, the polarization of the gate insulating layer 130 has little effect on the conduction of the carrier, and the change in the threshold voltage is also small so that the memory window cannot be sufficiently secured. On the contrary, when the channel length is 1 µm or less, the potential near the source and the drain starts coupling near the center of the channel. Therefore, the polarization of the gate insulating layer 130 affects the conductivity of the carrier, and the change in the threshold voltage becomes large so that the memory window can be sufficiently secured. When the channel length is 50 nm or less, the coupling near the center of the channel of the potential near the source and the drain is remarkable. Therefore, since the polarization of the gate insulating layer 130 gives a large change to the potential near the center of the channel and greatly changes the threshold voltage, the width of the memory window also varies greatly.

As described above, in the non-volatile memory element 200 of the present embodiment, a larger width of the memory window can be secured by setting the channel length to 50 nm or less.

Figure 26A:
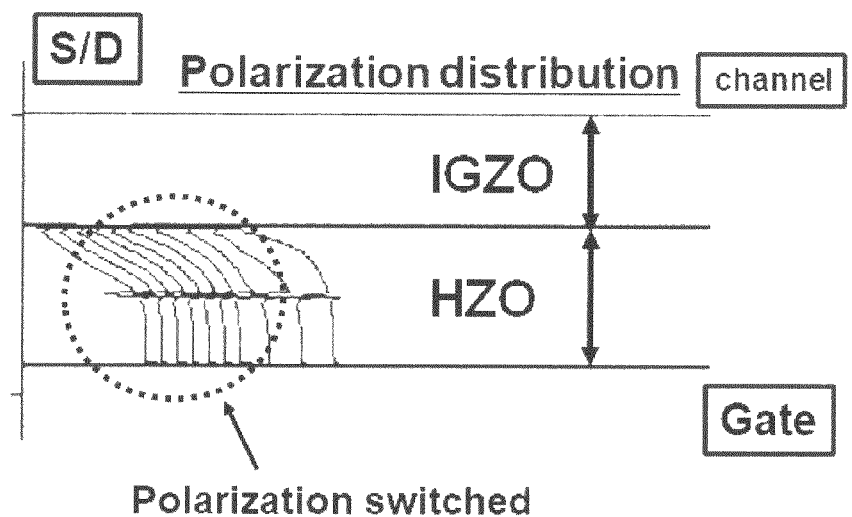
FIG. 26A and FIG. 26B are diagrams for explaining a potential distribution of a channel layer in a vicinity of a source in the non-volatile memory element of the second embodiment.
Figure 26B:
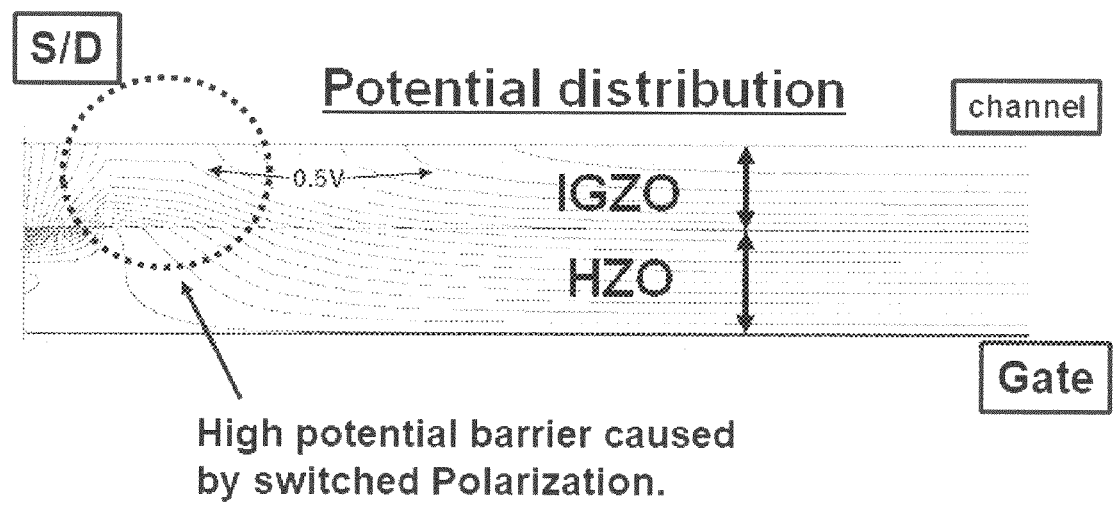

FIG. 26A and FIG. 26B are diagrams for explaining a potential distribution of the channel layer 140 in the vicinity of the source in the non-volatile memory element 200 of the present embodiment. Specifically, FIG. 26A is a diagram showing a polarization distribution of the gate insulating layer 130 in the vicinity of the source at the time of the erase operation. FIG. 26B is a diagram showing a potential distribution of the channel layer 140 in the vicinity of the source at the time of the erase operation. In FIG. 26A and FIG. 26B, although the behavior near the source is described, the same behavior is also shown for the potential distribution near the drain. This simulation was performed with the thickness of the gate insulating layer 130 was 15 nm, and the thickness of the channel layer 140 was 8 nm.

As shown in FIG. 26A, in the non-volatile memory element 200 of the present embodiment, polarization inversion occurs in the gate insulating layer 130 in the vicinity of the source at the time of the erase operation. As shown in FIG. 26B, due to the polarization inversion of the gate insulating layer 130, a high potential barrier is formed in the channel layer 140 near the source. This is because the body potential of the channel portion of the non-volatile memory element 200 is fixed by setting the channel length to 1 μm or less, and polarization inversion is likely to occur.

Figure 27A:
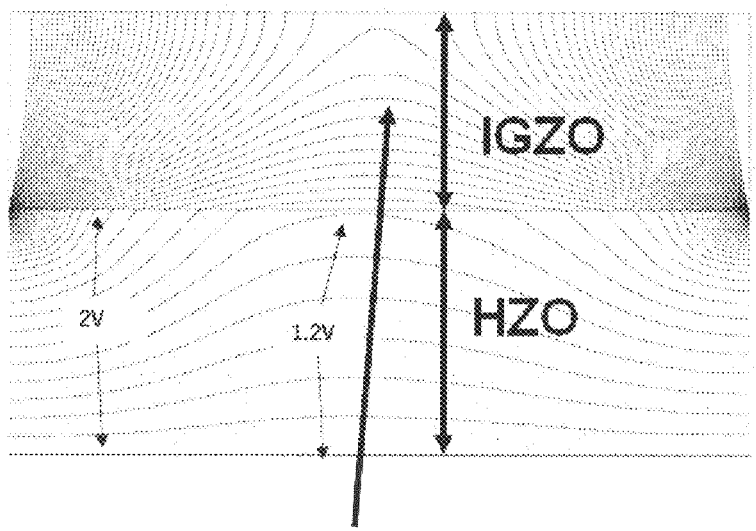
FIG. 27A and FIG. 27B are diagrams for explaining a potential distribution of a channel layer in the non-volatile memory element of the second embodiment.
Figure 27B:
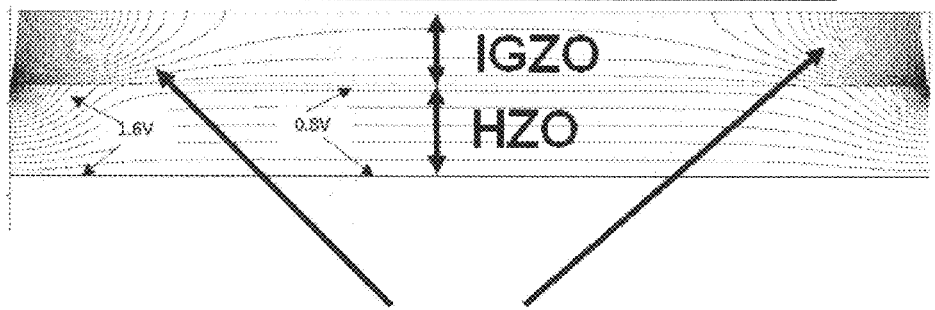

FIG. 27A and FIG. 27B are diagrams for explaining a potential distribution of the channel layer 140 in the non-volatile memory element 200 of the present embodiment. Specifically, FIG. 27A is a diagram showing the potential distribution of the channel layer 140 when the channel length is 30 nm. FIG. 27B is a diagram showing the potential distribution of the channel layer 140 when the channel length is 100 nm. This simulation was performed with the thickness of the gate insulating layer 130 was 15 nm, and the thickness of the channel layer 140 was 8 nm.

As shown in FIG. 27A, when the channel length is 30 nm, the channel potential is strongly coupled to the source and drain potentials near the center of the channel, thereby strongly fixing the potential of the channel. On the other hand, as shown in FIG. 27B, when the channel length is 100 nm, the coupling of the potential near the center of the channel is slight. That is, these simulation results support the results described using FIG. 25B. That is, as the channel length is shortened, the potential near the center of the channel is strongly coupled, resulting in a wider and stronger polarization inversion, indicating a sharp increase in the memory window.

Third Embodiment

In a third embodiment, a non-volatile memory device 400 in which a plurality of non-volatile memory elements 300 is integrated into a three-dimensional structure will be described. Specifically, the non-volatile memory device 400 of the present embodiment is an example of a non-volatile memory device (ferroelectric memory device) having a three-dimensional stacked structure in which the plurality of non-volatile memory elements 300 is arranged in series with a common channel. Such a three-dimensional stacked structure has a structure similar to that of 3D-NAND flash memory.

Figure 21:
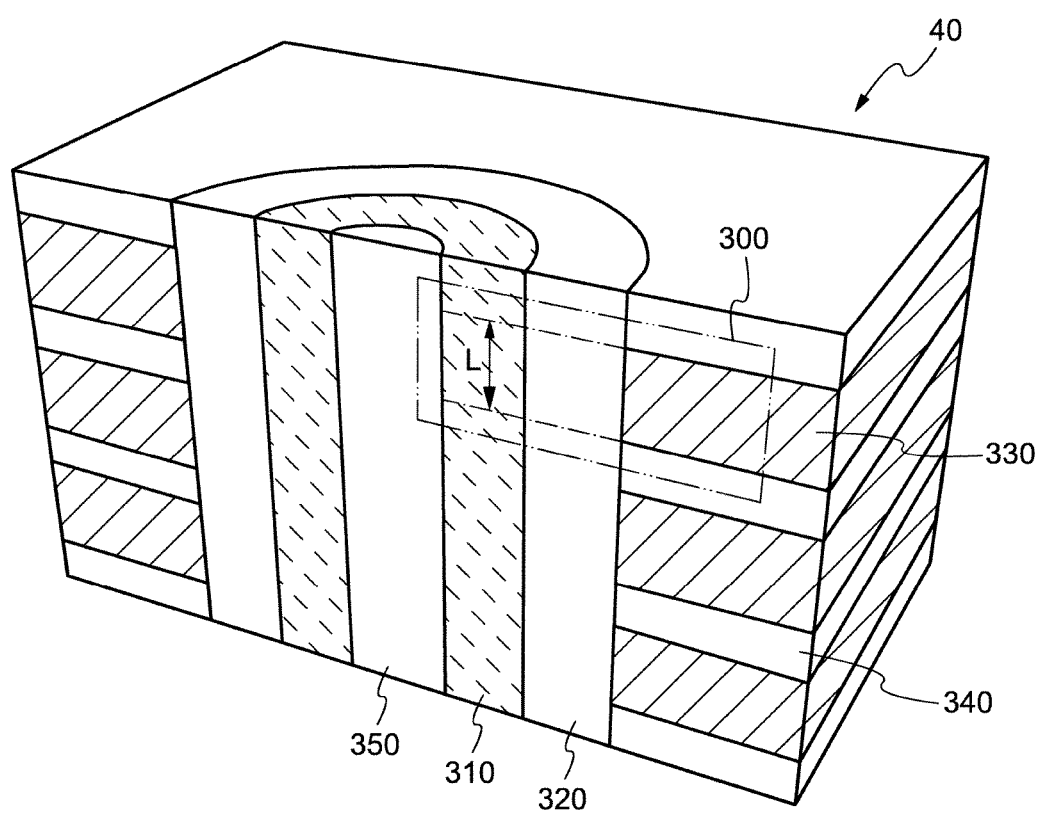
FIG. 21 is a cross-sectional perspective view showing an element structure in a non-volatile memory element of a third embodiment.
Figure 22:
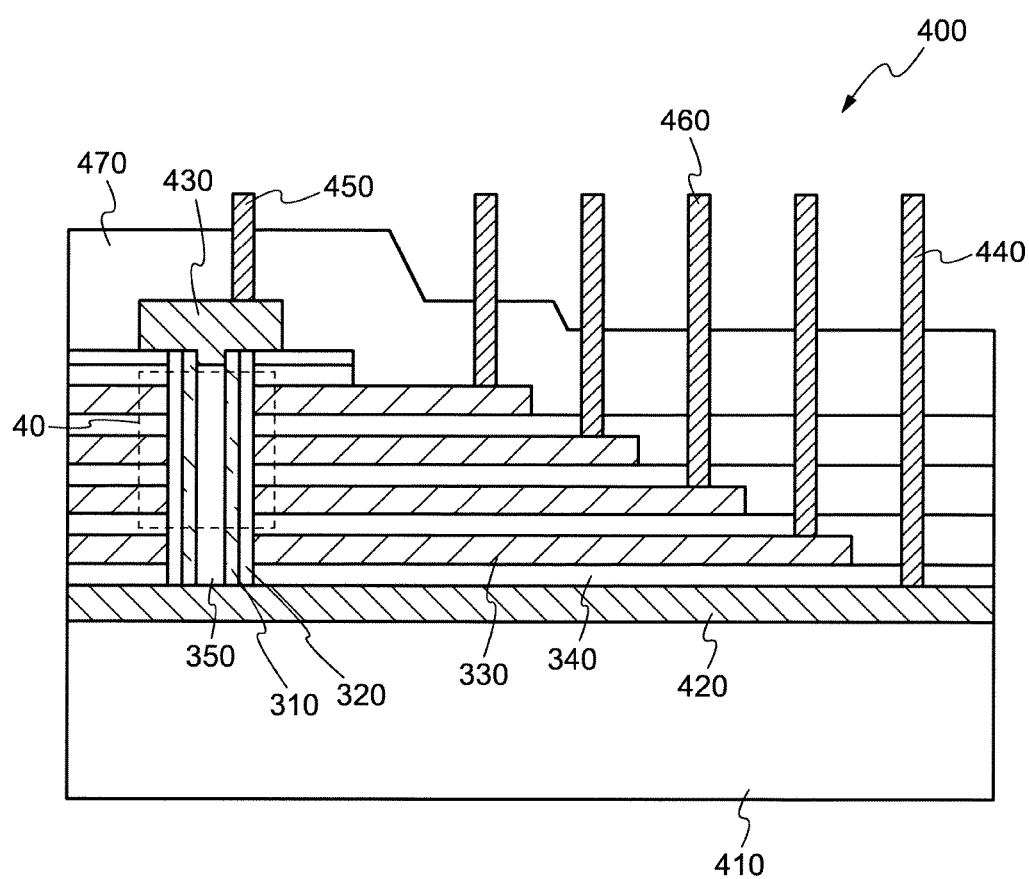
FIG. 22 is a cross-sectional view showing a device structure in the non-volatile memory device of the third embodiment.

FIG. 21 is a cross-sectional perspective view showing an element structure in the non-volatile memory element 300 of the third embodiment. FIG. 22 is a cross-sectional view showing a device structure in the non-volatile memory device 400 of the third embodiment. The cross-sectional perspective view shown in FIG. 21 corresponds to an enlarged drawing of the area shown by a frame border 40 in FIG. 22.

As shown in FIG. 21, the non-volatile memory element 300 is an FeFET having at least a channel layer 310, a gate insulating layer 320, and a gate electrode 330. In the present embodiment, the channel layer 310 and the gate insulating layer 320 are common to the plurality of non-volatile memory elements 300.

The channel layer 310 functions as a channel of the non-volatile memory element 300. In the present embodiment, although an IGZO film is used as a material constituting the channel layer 310, other metal oxides may be used as in the first embodiment. In the present embodiment, the thickness of the channel layer 310 is less than 10 nm (preferably 8 nm or less). In the present embodiment, the channel layer 310 is formed using the ALD method.

The gate insulating layer 320 corresponds to the ferroelectric layer in the non-volatile memory element 300 of the present embodiment. In the present embodiment, although an HZO film is used as a material of the gate insulating layer 320, other ferroelectric layers may be used as in the first embodiment.

The gate electrode 330 functions as the gate electrode of the non-volatile storage device 300. In the present embodiment, a compound layer composed of titanium nitride (TiN) is used as the gate electrode 330. However, the present invention is not limited to this, and a metal material including tungsten, tantalum, molybdenum, aluminum, copper, or the like, or a compound material containing these metal materials can be used as the material of the gate electrode 330.

In the non-volatile memory device 300 of the present embodiment, the thickness of the gate electrode 330 is 1 μm or less (preferably 50 nm or less). As is apparent from FIG. 21, the thickness of the gate electrode 330 defines an effective channel length (L) of the non-volatile memory element 300. Therefore, as in the second embodiment, the non-volatile memory element 300 of the present embodiment has a structure in which the body potential of the channel portion is fixed by setting the thickness (that is, the channel length) of the gate electrode 330 to be 1 μm or less.

An insulating layer 340 is an insulating film for insulating and separating the adjacent gate electrodes 330. An insulating film such as a silicon oxide film, a silicon nitride film can be used as the insulating layer 340. In the present embodiment, although the thickness of the insulating layer 340 is not particularly limited, it is preferably 10 nm or more and 50 nm or less (preferably, 20 nm or more and 40 nm or less). If the thickness of the insulating layer 340 is too small, the adjacent non-volatile memory elements 300 may affect each other, which may cause operation failure. If the thickness of the insulating layer 340 is too thick, distances between the adjacent non-volatile memory elements 300 will be long and may be a barrier to carrier movement.

A filler member 350 functions as a filler that fills the inside of the cylindrical channel layer 310. An insulating material such as silicon oxide, silicon nitride, and a resin can be used as the filler member 350.

In FIG. 22, a source electrode 420 is provided on a substrate 410. A silicon substrate or a metal substrate having an insulating surface, or the like can be used as the substrate

410. A metal material including titanium, aluminum, tungsten, tantalum, molybdenum, aluminum, copper, or the like, or a compound material containing these metal materials can be used as the source electrode 420. An n-type semiconductor substrate (e.g., an n-type silicon substrate) is used as the substrate 410 to function as a source, and it is also possible to omit the source electrode 420 shown in FIG. 22.

The plurality of non-volatile memory elements 300 is arranged in series between the source electrode 420 and a drain electrode 430. The channel layer 310 is electrically connected to the source electrode 420 and the drain electrode 430. That is, in the non-volatile memory device 400 of the present embodiment, it can be said that the plurality of non-volatile memory elements 300 also share the source electrode 420 and the drain electrode 430.

The source electrode 420 is electrically connected to a source terminal 440 composed of a metal material. The drain electrode 430 is electrically connected to a drain terminal 450 composed of a metal material. The drain terminal 450 is connected to a bit line (not shown) of the non-volatile memory device 400. The plurality of gate electrodes 330 is electrically connected to gate terminals 460, respectively. The plurality of gate terminals 460 is connected to word lines (not shown) of the non-volatile memory device 400. The source terminal 440, the drain terminal 450, and the gate terminal 460 are electrically connected to the source electrode 420, the drain electrode 430, and the gate electrode 330, respectively, via contact holes provided in a passivating layer 470.

As described above, the non-volatile memory device 400 of the present embodiment has a three-dimensional structure in which the plurality of non-volatile memory elements 300 is integrated at high density. The Individual non-volatile memory element 300 fixes the body potential of the channel portion using the source-side potential and the drain-side potential by setting the channel length to 1 μm or less. That is, as in the first embodiment and the second embodiment, the non-volatile memory device 400 can be realized by using the non-volatile memory device 300 having low power consumption and high reliability. Thus, according to the present embodiment, it is possible to obtain the non-volatile memory device 400 having a large capacity, low power consumption, and high reliability.

Fourth Embodiment

In the fourth embodiment, a method of operating a non-volatile memory device applicable to a non-volatile memory element having a configuration different from that of the first embodiment and the second embodiment will be described. The difference from the first embodiment and the second embodiment is that the method of operating the non-volatile memory device of the present embodiment does not have a back gate electrode and can be applied to a non-volatile memory element having a channel length of more than 1 μm. The method of operating the non-volatile memory device of the present embodiment is different in that, in the simulations described in the first embodiment and the second embodiment, the drain voltage at the erase operation is set to 0 V, whereas the memory window is controlled by applying a positive drain voltage (a positive drain voltage above at least 50 mV) at the erase operation. In the simulations described in the first embodiment and the second embodiment, for convenience of simulation, since the drain-source voltage of 50 mV was applied at the erase operation as in the read operation, the drain voltage of 50 mV was applied at the erase operation. However, since the influence on the drain current at the time of reading is almost negligible, there is substantially no difference from the case where the drain voltage at the time of the erase operation is set to 0 V.

In the present embodiment, the "drain voltage" refers to a potential difference between the reference potential and the potential of the drain electrode. "Source voltage" refers to a potential difference between the reference potential and the potential of the source electrode. "Gate voltage" refers to a potential difference between the reference potential and the potential of the gate electrode. "Drain-source voltage" refers to a potential difference between the drain potential and the source potential. By applying the method of operating the non-volatile memory device of the present embodiment to the non-volatile memory device of the first embodiment, the second embodiment, or the third embodiment, it is possible to use as the non-volatile memory device having a wider memory window.

Figure 28A:
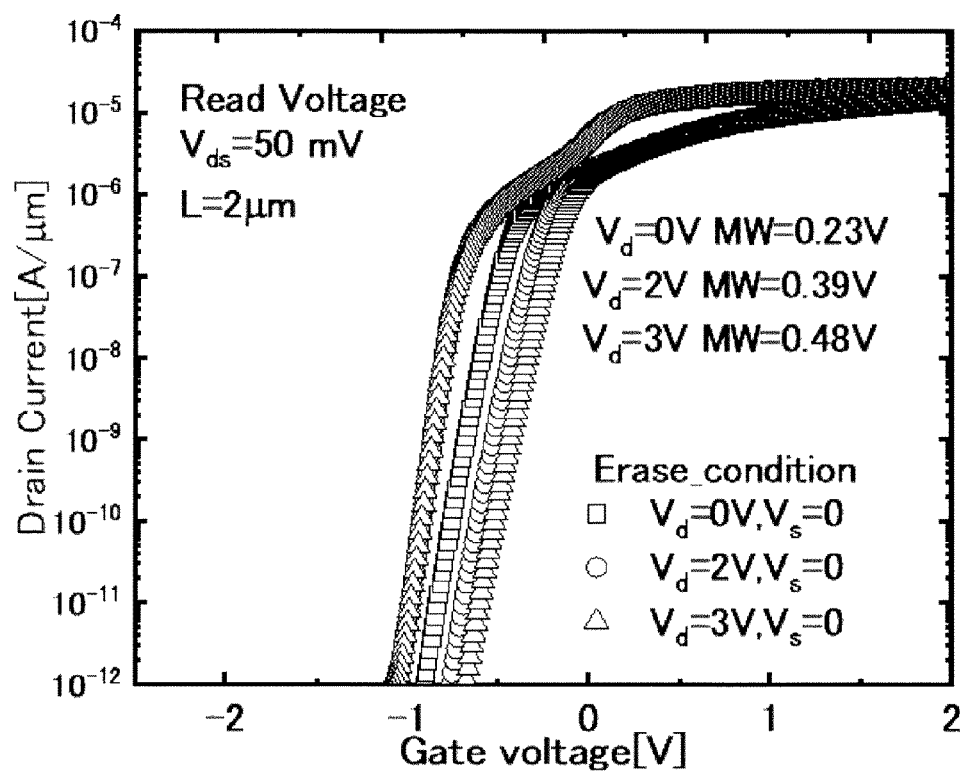
FIG. 28A and FIG. 28B are diagrams showing a dependency of a memory window on a drain voltage at a time of erase operation in a non-volatile memory device of a fourth embodiment.

FIG. 28A is a diagram showing Id-Vg characteristics obtained by applying a drain-source voltage and sweeping the gate voltage after performing an erase operation (operation to align a polarization direction of a ferroelectric layer in a specific direction by applying a negative gate voltage) or a program operation (operation to align a polarization direction of a ferroelectric layer in the opposite direction to the specific direction by applying a positive gate voltage) by changing the applied drain voltage in the non-volatile memory device of the fourth embodiment. It can be seen that although the drain voltage at the time of the program operation (hereinafter referred to as "program drain voltage") has almost no effect on the threshold voltage of the Id-Vg characteristics, the drain voltage at the time of the erase operation (hereinafter referred to as "erase drain voltage") affects the threshold voltage of the Id-Vg characteristics.

Figure 28B:
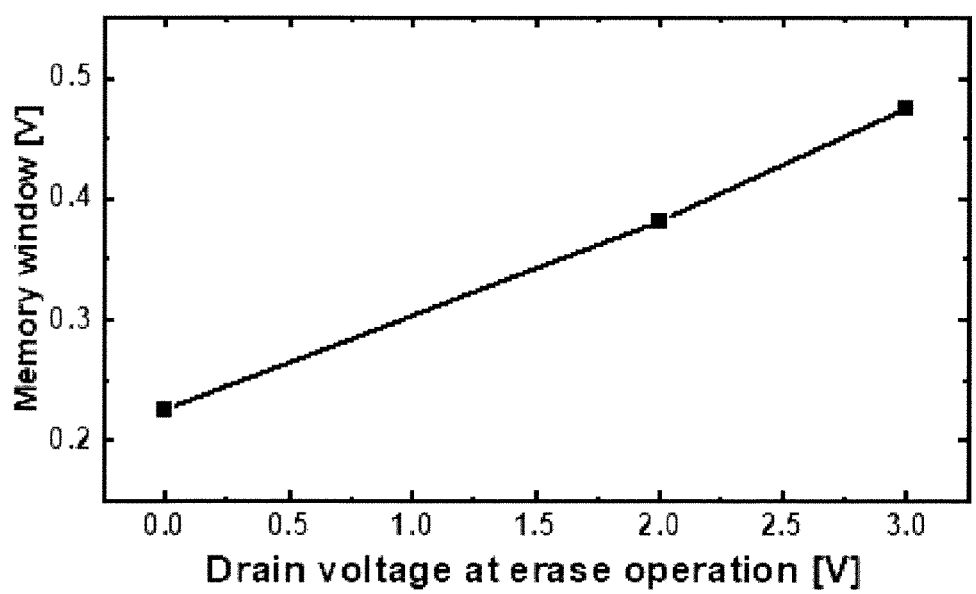

FIG. 28B is a diagram showing a dependency of a memory window on an erase drain voltage in the non-volatile memory device of the fourth embodiment. Specifically, FIG. 28B shows a width of the memory window determined from a difference between the simulation results of the Id-Vg characteristics after the erase of the spontaneous polarization and the simulation results of the Id-Vg characteristics after the program of the spontaneous polarization. The Id-Vg characteristics after the erase of the spontaneous polarization are the Id-Vg characteristics when the gate voltage is swept by applying the drain-source voltage of 50 mV after erasing the spontaneous polarization of the ferroelectric layer by setting the erase drain voltage to Vd=0 V, 2 V, or 3 V. The Id-Vg characteristics after the program of the spontaneous polarization are the Id-Vg characteristics when the gate voltage is swept by applying the drain-source voltage of 50 mV after programming the spontaneous polarization of the ferroelectric layer. In this example, the simulation was performed with the thickness of the ferroelectric layer was 15 nm, the thickness of the channel layer was 8 nm, the channel length was 2 μm.

In the simulation of the present embodiment, first, an erased state was formed by erasing the spontaneous polarization of the ferroelectric layer with the negative gate voltage and the erase drain voltage applied. Then, the gate voltage was swept with the drain-source voltage of 50 mV applied, and the Id-Vg characteristics shown in FIG. 28A were obtained. For example, when the erase drain voltage Vd was 3 V, the erase operation was performed with the negative gate voltage as −5 V and the source voltage as 0 V, and then sweep of the gate voltage was performed with the drain-source voltage as 50 mV to obtain the Id-Vg characteristics. The Id-Vg characteristics were obtained by the same procedure when the erase drain voltage Vd was 0 V and 2 V. In other words, FIG. 28A shows the result of performing the erase operation separately when the erase drain voltage Vd is 0 V, 2 V, and 3 V, and sweeping the gate voltage with the drain-source voltage set to 50 mV. Similarly, a programmed state was formed by programming the spontaneous polarization of the ferroelectric layer with the positive gate voltage and the program drain voltage applied. Then, the gate-voltage was swept with the drain-source voltage at 50 mV, and the Id-Vg characteristics shown in FIG. 28A were obtained.

As shown in FIG. 28B, it was found that the larger the erase-drain voltage, the larger the memory window. This means that the larger the erase drain voltage, the larger the erase is occurring at the time of the erase operation with the negative gate voltage. It is considered that this is because the larger the erase drain voltage is, the larger voltage is applied to the gate insulating layer between the gate electrode and the channel layer in the vicinity of the drain. Although it is preferable that the erase drain voltage is large, it is preferable to set the power source voltage as the upper limit in consideration of the ease of circuit design. For example, when power source voltage is 3.3 V or 5 V, the erase drain voltage is preferably greater than 0 V, and equal to or smaller than 3.3V, or greater than 0 V, and equal to or smaller than 5 V. However, the erase drain voltage is preferably in a range where the influence of the leakage current between the gate and the drain does not matter.

In the present embodiment, although the source voltage at the time of the erase operation was fixed to 0 V, to perform a stronger erase operation, the source voltage at the time of the erase operation may be set to a positive voltage (for example, the same voltage as the erase drain voltage) as the erase drain voltage. In particular, in the third embodiment, the plurality of non-volatile memory elements is arranged in series between the source electrode and the drain electrode. These non-volatile memory elements are configured such that, among the channel layer, a portion that overlaps with the gate electrode via the ferroelectric layer in a direction substantially parallel to the surface of the substrate operates as the channel, and a portion that overlaps with the insulating layer in a direction substantially parallel to the surface of the substrate operates as the source and the drain. Thus, since the source of a certain element also serves as a drain of the adjacent element, setting the erase drain voltage of each element to a positive voltage is equal to setting the source voltage at the time of the erase operation of each element to a positive voltage.

According to the above simulation results, it can be seen that if the erased state is formed with the erased drain voltage as a positive voltage, a sufficient memory window can be secured without providing the back gate electrode as in the first embodiment or setting the channel length to 1 μm or less as in the second embodiment. Further, it can be seen that the larger the erase drain voltage is, the larger the memory window can be secured. It can be seen that the program drain voltage can be either a positive voltage or 0 V.

As described above, the following matters are grasped from the present embodiment.

(1) A method of operating a non-volatile memory device including a plurality of non-volatile memory elements, each of the non-volatile memory elements including:
a channel layer containing a metal oxide;
a ferroelectric layer in contact with the channel layer, the ferroelectric layer containing hafnium oxide;
a gate electrode facing the channel layer via the ferroelectric layer,
a source electrode in contact with the channel layer, and
a drain electrode separated from the source electrode and in contact with the channel layer,
the method comprising:
an erase operation in which a negative gate voltage is applied to the gate electrodes and a positive first drain voltage is applied to the drain electrodes in at least a part of the plurality of non-volatile memory elements; and
a program operation in which a positive gate voltage is applied to the gate electrodes and a second drain voltage is applied to the drain electrodes in at least a part of the plurality of non-volatile memory elements.

(2) The method of operating the non-volatile memory device according to (1), wherein the second drain voltage is a positive drain voltage or 0 V.

(3) The method of operating the non-volatile memory device according to (1), wherein the first drain voltage is greater than the second drain voltage.

In the present embodiment, although the method of operating the non-volatile memory device including the non-volatile memory element that does not have a back gate electrode and includes a channel length of more than 1 μm has been described, the present invention is not limited to this example. The method of operating the present embodiment can also be applied as the method of operating a non-volatile memory device including the non-volatile memory element described in the first embodiment and the second embodiment.

Each of the embodiments described above as an embodiment of the present invention can be appropriately combined and implemented as long as they do not contradict each other. The addition, deletion, or design change of components as appropriate by those skilled in the art based on the non-volatile memory element or the non-volatile memory device of each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A ferroelectric memory device comprising:
a plurality of ferroelectric memory elements, each of the plurality of ferroelectric memory elements comprising:
a channel layer containing a metal oxide;
a ferroelectric layer in contact with the channel layer, the ferroelectric layer containing hafnium oxide;
a first gate electrode facing the channel layer via the ferroelectric layer;
an insulating layer facing the ferroelectric layer via the channel layer; and
a second gate electrode facing the channel layer via the insulating layer,
wherein a body potential of the channel layer is fixed at a constant potential by the second gate electrode.

2. The ferroelectric memory device according to claim 1, wherein the insulating layer includes silicon oxide.

3. A ferroelectric memory device comprising:
a plurality of ferroelectric memory elements, each of the plurality of ferroelectric memory elements comprising:
a channel layer containing a metal oxide;

a ferroelectric layer in contact with the channel layer, the ferroelectric layer containing hafnium oxide;
a first gate electrode facing the channel layer via the ferroelectric layer;
an insulating layer facing the ferroelectric layer via the channel layer; and
a second gate electrode facing the channel layer via the insulating layer,
wherein a channel length of the channel layer is 1 µm or less.

4. The ferroelectric memory device according to claim 3, wherein the channel length of the channel layer is 20 nm or more and 1 µm or less.

5. A ferroelectric memory device comprising:
a plurality of ferroelectric memory elements, each of the plurality of ferroelectric memory elements comprising:
a channel layer containing a metal oxide;
a ferroelectric layer in contact with the channel layer, the ferroelectric layer containing hafnium oxide;
a first gate electrode facing the channel layer via the ferroelectric layer;
an insulating layer facing the ferroelectric layer via the channel layer; and
a second gate electrode facing the channel layer via the insulating layer,
wherein a ratio of a thickness of the insulating layer to a thickness of the channel layer is 1.0 or more and 1.8 or less.

6. A ferroelectric memory device comprising:
a plurality of ferroelectric memory elements, each of the plurality of ferroelectric memory elements comprising:
a channel layer containing a metal oxide;
a ferroelectric layer in contact with the channel layer, the ferroelectric layer containing hafnium oxide; and
a gate electrode facing the channel layer via the ferroelectric layer, wherein
a channel length of the channel layer is 1 µm or less.

7. The ferroelectric memory device according to claim 6, wherein the channel length of the channel layer is 50 nm or less.

8. The ferroelectric memory device according to claim 7, wherein the channel length of the channel layer is 20 nm or more and 50 nm or less.

9. The ferroelectric memory device according to claim 6, wherein the metal oxide is IGZO, ITO, IZO, or ITZO.

10. The ferroelectric memory device according to claim 6, wherein a thickness of the channel layer is less than 10 nm.

11. The ferroelectric memory device according to claim 10, wherein the thickness of the channel layer is 1 nm or more and 8 nm or less.

12. The ferroelectric memory device according to claim 6, wherein a thickness of the ferroelectric layer is 5 nm or more and 20 nm or less.

13. The ferroelectric memory device according to claim 6, wherein the channel length of the channel layer is 20 nm or more and 1 µm or less.

14. A method of operating a ferroelectric memory device including a plurality of ferroelectric memory elements, each of the plurality of ferroelectric memory elements comprising:
a channel layer containing a metal oxide and having a channel length of 1 µm or less;
a ferroelectric layer in contact with the channel layer, the ferroelectric layer containing hafnium oxide;
a gate electrode facing the channel layer via the ferroelectric layer,
a source electrode in contact with the channel layer, and
a drain electrode separated from the source electrode and in contact with the channel layer,
the method comprising:
an erase operation in which a negative gate voltage is applied to the gate electrodes and a positive first drain voltage is applied to the drain electrodes in at least a part of the plurality of ferroelectric memory elements; and
a program operation in which a positive gate voltage is applied to the gate electrodes and a second drain voltage is applied to the drain electrodes in at least a part of the plurality of ferroelectric memory elements.

15. The method of operating a ferroelectric memory device according to claim 14, wherein the second drain voltage is a positive voltage or 0V.

16. The method of operating a ferroelectric memory device according to claim 14, wherein the first drain voltage is greater than the second drain voltage.

17. The method of operating a ferroelectric memory device according to claim 14, wherein the channel length of the channel layer is 20 nm or more and 1 µm or less.

* * * * *